United States Patent
Nakamura et al.

(10) Patent No.: US 7,812,688 B2
(45) Date of Patent: Oct. 12, 2010

(54) SURFACE ACOUSTIC WAVE FILTER, BOUNDARY ACOUSTIC WAVE FILTER, AND ANTENNA DUPLEXER USING SAME

(75) Inventors: Hiroyuki Nakamura, Osaka (JP); Tetsuya Tsurunari, Osaka (JP); Ken Matsunami, Osaka (JP); Hidekazu Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 173 days.

(21) Appl. No.: 12/134,854

(22) Filed: Jun. 6, 2008

(65) Prior Publication Data
US 2008/0315973 A1    Dec. 25, 2008

(30) Foreign Application Priority Data
Jun. 19, 2007 (JP) .............................. 2007-161075

(51) Int. Cl.
*H03H 9/00* (2006.01)
*H03H 9/64* (2006.01)
(52) U.S. Cl. ....................................... 333/133; 333/196
(58) Field of Classification Search ................ 333/133, 333/193, 194, 195, 196
See application file for complete search history.

(56) References Cited

U.S. PATENT DOCUMENTS
5,654,680 A * 8/1997 Kwan et al. ................. 333/195
6,025,763 A * 2/2000 Morimoto ................... 333/195

FOREIGN PATENT DOCUMENTS

| JP | 08-032397 | * | 2/1996 |
| JP | H09-246911 A | | 9/1997 |
| JP | 2001-500697 A | | 1/2001 |
| WO | WO 2005/011117 A1 | | 2/2005 |

* cited by examiner

*Primary Examiner*—Dean O Takaoka
(74) *Attorney, Agent, or Firm*—Panasonic Patent Center; Dhiren Odedra; Kerry Culpepper

(57) ABSTRACT

A surface acoustic wave filter includes a piezoelectric substrate including lithium niobate, a series resonator including a first interdigital transducer electrode provided on the piezoelectric substrate, and a parallel resonator including a second interdigital transducer electrode provided on the piezoelectric substrate and being electrically connected to the series resonator. An apodized weighting factor of the first interdigital transducer electrode is smaller than an apodized weighting factor of the second interdigital transducer electrode. This surface acoustic wave filter has a small loss.

21 Claims, 22 Drawing Sheets

SURFACE ACOUSTIC WAVE FILTER, BOUNDARY ACOUSTIC WAVE FILTER, AND ANTENNA DUPLEXER USING SAME

BACKGROUND

The present invention relates to a surface acoustic wave filter, a boundary acoustic wave filter, and an antenna duplexer including them and used in electronic devices, such as portable telephones.

FIGS. 28 and 29 are top views of surface acoustic wave resonator 3 of a conventional surface acoustic wave filter. Surface acoustic wave resonator 3 includes piezoelectric substrate 1 and interdigital transducer electrode 2 provided on an upper surface of piezoelectric substrate 1. Interdigital transducer electrode 2 includes comb electrodes 2A and 2B facing each other on the upper surface of piezoelectric substrate 1. Interdigital transducer electrode 2 of surface acoustic wave resonator 3 has a large apodized weighting factor. In other words, the ratio of the sum of the areas of regions 5A, 5B, 5C, and 5D where electrodes do not face to the area of excitation region 4 is large.

FIG. 30 shows frequency characteristics of a surface acoustic wave filter including surface acoustic wave resonator 3 as a series resonator electrically connected in series between input and output terminals. The propagation of the surface acoustic wave filter at anti-resonance frequency $f_{AR}$ is reduced to increase a Q factor, accordingly reducing a loss.

FIG. 31 shows frequency characteristics of a surface acoustic wave filter using surface acoustic wave resonator 3 as a parallel resonator electrically connected in parallel to input and output terminals. The propagation of the surface acoustic wave filter at anti-resonance frequency $f_{AR}$ is increased to reduce the loss.

The surface acoustic wave filter including surface acoustic wave resonator 3 as a series resonator has a large loss of transmission characteristics especially at resonance frequency $f_R$.

SUMMARY

A surface acoustic wave filter includes a piezoelectric substrate including lithium niobate, a series resonator including a first interdigital transducer electrode provided on the piezoelectric substrate, and a parallel resonator including a second interdigital transducer electrode provided on the piezoelectric substrate and being electrically connected to the series resonator. An apodized weighting factor of the first interdigital transducer electrode is smaller than an apodized weighting factor of the second interdigital transducer electrode.

This surface acoustic wave filter has a small loss.

DETAILED DESCRIPTION

Figure 1:
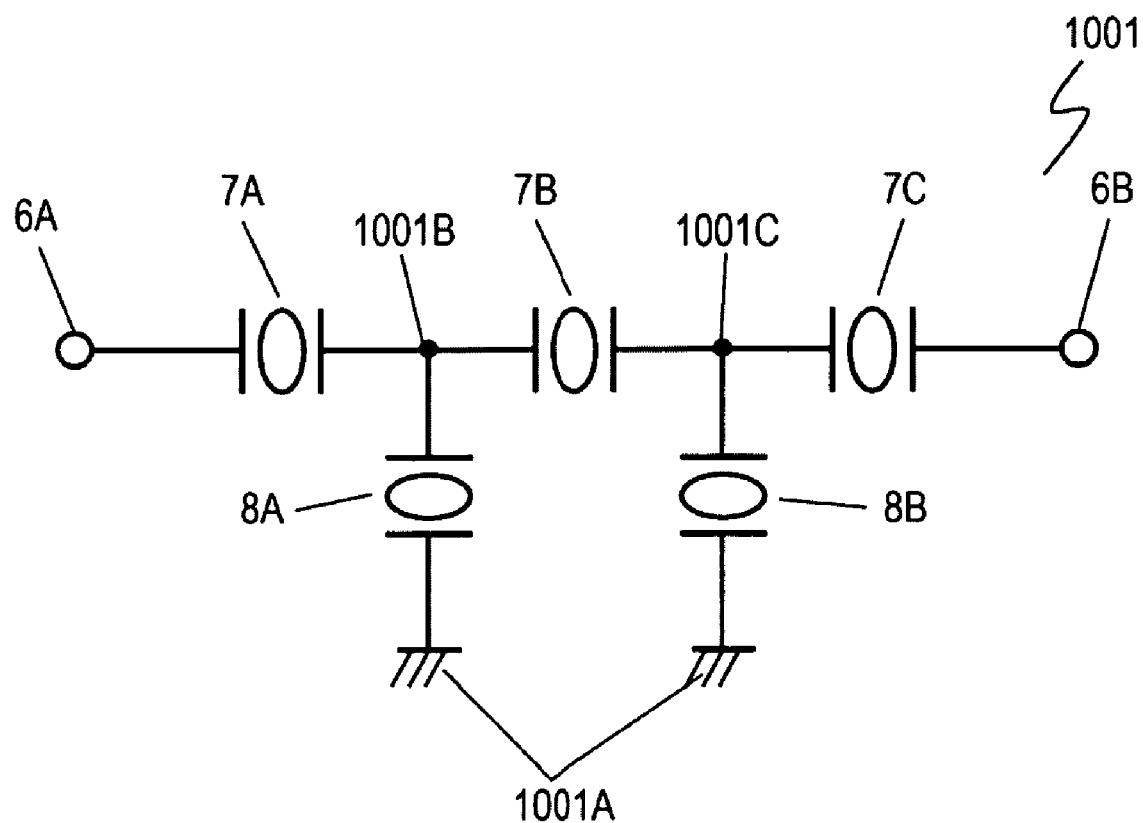
FIG. 1 is a circuit diagram of a surface acoustic wave filter according to an exemplary embodiment of the present invention.

FIG. 1 is a circuit diagram of surface acoustic wave filter 1001 according to an exemplary embodiment of the present invention. Surface acoustic wave filter 1001 includes input terminal 6A, output terminal 6B, series resonators 7A, 7B, and 7C, and parallel resonators 8A and 8B electrically connected to series resonators 7A, 7B, and 7C. Series resonators 7A, 7B, and 7C are electrically connected in series between terminals 6A and 6B. Series resonators 7A and 7B are connected to each other at node 1001B. Series resonators 7B and 7C are connected to each other at node 1001C. Parallel resonator 8A is connected between node 1001B and ground 1001A. Parallel resonator 8B is connected between node 1001C and ground 1001A. Thus, parallel resonators 8A and 8B are connected in parallel to terminals 6A and 6B.

Figure 2:
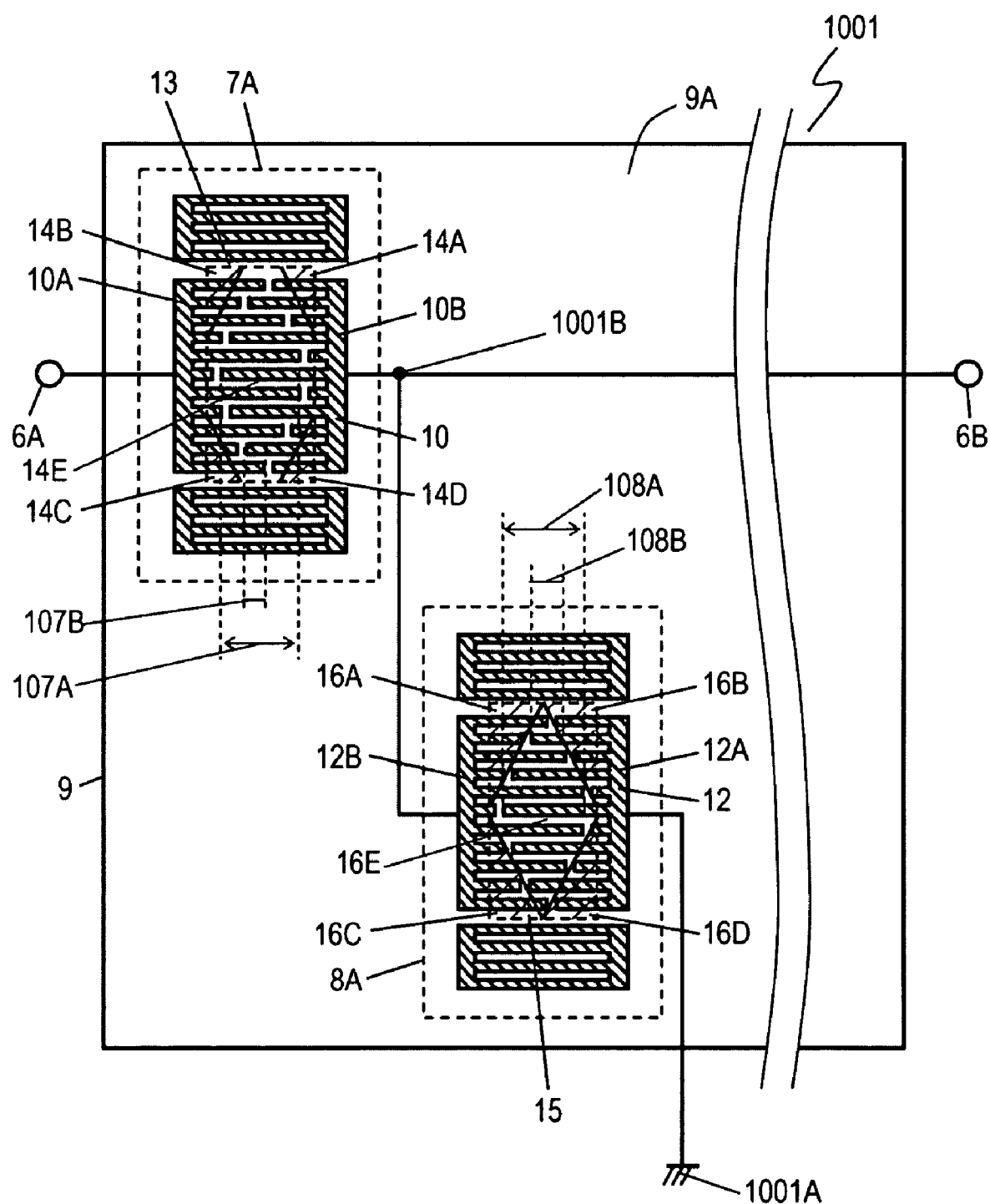
FIG. 2 is a top view of the surface acoustic wave filter according to the embodiment.

FIG. 2 is a top view of surface acoustic wave filter 1001. Surface acoustic wave filter 1001 includes piezoelectric substrate 9 made of piezoelectric material. According to the embodiment, piezoelectric substrate 9 is made of −30° to +30° rotated Y-cut lithium niobate. Series resonator 7A includes interdigital transducer electrode 10 provided on upper surface 9A of piezoelectric substrate 9. Interdigital transducer electrode 10 includes comb electrodes 10A and 10B facing each other on upper surface 9A of piezoelectric substrate 9. Plural electrode fingers of comb electrode 10A are positioned interdigitally with plural electrode fingers of comb electrode 10B. That is, the electrode fingers of interdigital transducer electrode 10 are located interdigitally with each other. This means that the electrode fingers of comb electrode 10A face the electrode fingers of comb electrode 10B in a direction perpendicular to directions in which the electrode fingers of comb electrodes 10A and 10B extend. The electrode fingers of comb electrode 10A are positioned interdigitally with the electrode fingers of comb electrode 10B by facing width 107B at the ends of series resonator 7A and by facing width 107A at the center of series resonator 7A. Facing width 107B is smaller than facing width 107A. As shown in FIG. 2, the facing width of comb electrodes 10A and 10B of interdigital transducer electrode 10 decreases from the center toward the ends of series resonator 7A. Parallel resonator 8A includes interdigital transducer electrode 12 provided on upper surface 9A of piezoelectric substrate 9. Interdigital transducer electrode 12 includes comb electrodes 12A and 12B facing each other on upper surface 9A of piezoelectric substrate 9. Plural electrode fingers of comb electrode 12A are positioned interdigitally with plural electrode fingers of comb electrode 12B. That is, the electrode fingers of interdigital transducer electrode 12 are located interdigitally with each other. This means that the electrode fingers of comb electrode 12A face the electrode fingers of comb electrode 12B in a direction perpendicular to directions in which the electrode fingers of comb electrodes 12A and 12B extend. The electrode fingers of comb electrode 12A face the electrode fingers of comb electrode 12B by facing width 108B at the ends of parallel resonator 8A and by facing width 108A at the center of parallel resonator 8A. Facing width 108B is smaller than facing width 108A. As shown in FIG. 2, the facing width of comb electrodes 12A and 12B of interdigital transducer electrode 12 decreases from the center toward the ends of parallel resonator 8A.

Series resonator 7A has excitation region 13 in which a surface acoustic wave propagates between comb electrodes 10A and 10B of interdigital transducer electrode 10 to excite comb electrodes 10A and 10B. Excitation region 13 includes region (electrode facing region) 14E and regions (electrode non-facing regions) 14A to 14D. The electrode fingers of comb electrode 10A are positioned interdigitally with the electrode fingers of comb electrode 10B in electrode facing region 14E, and are not positioned interdigitally with the electrode fingers of comb electrode 10B in electrode non-facing regions 14A to 14D. The ratio of the sum of the areas of regions 14A to 14D to the area of excitation region 13 is defined as an apodized weighting factor of interdigital electrode 10. Parallel resonator 8A has excitation region 15 in which a surface acoustic wave propagates between comb electrodes 12A and 12B of interdigital transducer electrode 12 to excite comb electrodes 12A and 12B. Excitation region 15 includes region (electrode facing region) 16E and regions (electrode non-facing regions) 16A to 16D. The electrode fingers of comb electrode 12A are positioned interdigitally with the electrode fingers of comb electrode 12B in electrode facing region 16E, and are not positioned interdigitally with the electrode fingers of comb electrode 12B in electrode non-facing regions 16A to 16D. Similar to series resonator 7A, in parallel resonator 8A, the ratio of the sum of the areas of regions 16A to 16D to the area of excitation region 15 is defined as an apodized weighting factor of interdigital electrode 12. In surface acoustic wave filter 1001 according to the embodiment, the apodized weighting factor of series resonator 7A is smaller than the apodized weighting factor of parallel resonator 8A. According to the embodiment, the apodized weighting factors of series resonator 7A and parallel resonator 8A are about 0.3 and 0.5, respectively, but are not limited to these values.

Series resonators 7B and 7C shown in FIG. 1 have the same structure as series resonator 7A. Parallel resonator 8B has the same structure as parallel resonator 8A.

In surface acoustic wave filter 1001, series resonator 7A can have a high Q factor at a resonance frequency while parallel resonator 8A maintains a high Q factor at an anti-resonance frequency. Characteristics of surface acoustic wave filter 1001 will be described below.

Figure 3:
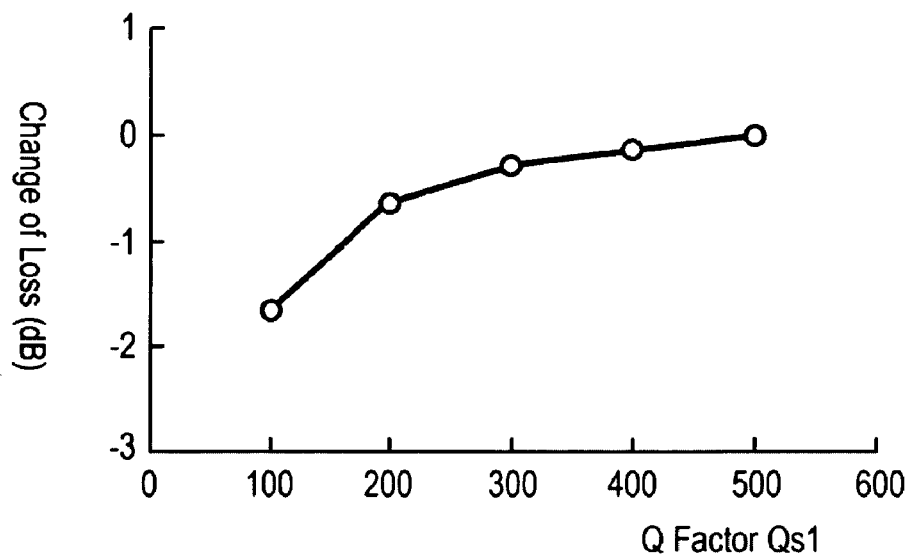
FIG. 3 shows characteristics of a series resonator of the surface acoustic wave filter according to the embodiment.

FIG. 3 shows the relation between Q factor Qs1 of each of series resonators 7A, 7B, and 7C at the resonance frequency and the loss of surface acoustic wave filter 1001. In FIG. 3, the vertical axis represents a change of the loss. The loss at Q factor Qs1 of 500 is determined as a reference loss, and the change of the loss is indicated as a ratio to the reference loss.

As shown in FIG. 3, the loss of surface acoustic wave filter 1001 increases according to the decreasing of Q factor Qs1 of series resonators 7A, 7B, and 7C at the resonance frequency from 500 to 100.

Figure 4:
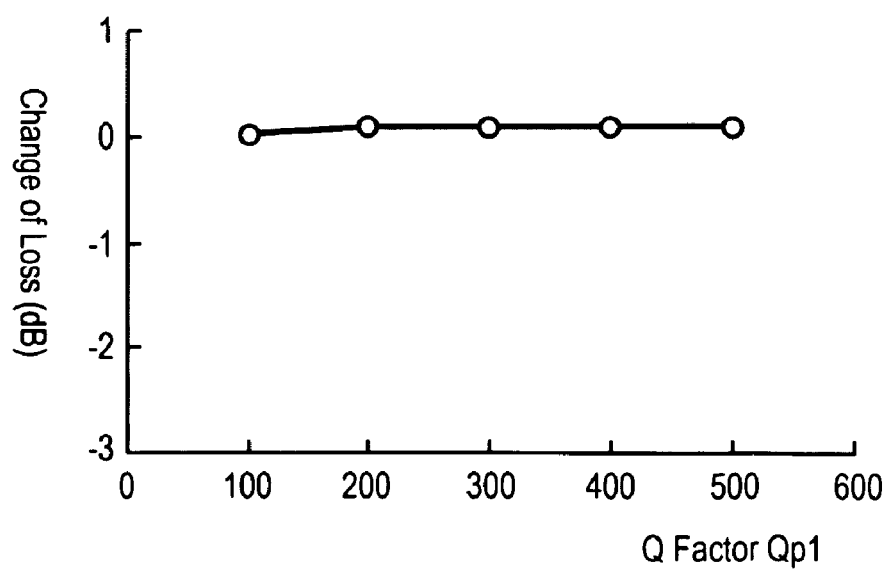
FIG. 4 shows characteristics of the series resonator of the surface acoustic wave filter according to the embodiment.

FIG. 4 shows the relation between Q factor Qp1 of series resonators 7A, 7B, and 7C at the anti-resonance frequency and the loss of surface acoustic wave filter 1001. In FIG. 4, the vertical axis represents the change of the loss. The loss at Q factor Qp1 of 500 is determined as a reference loss, and the change of the loss is indicated as a ratio to the reference loss.

As shown in FIG. 4, Q factor Qp1 of series resonators 7A, 7B, and 7C at the anti-resonance frequency does not affect the loss of surface acoustic wave filter 1001 very much.

Figure 5:
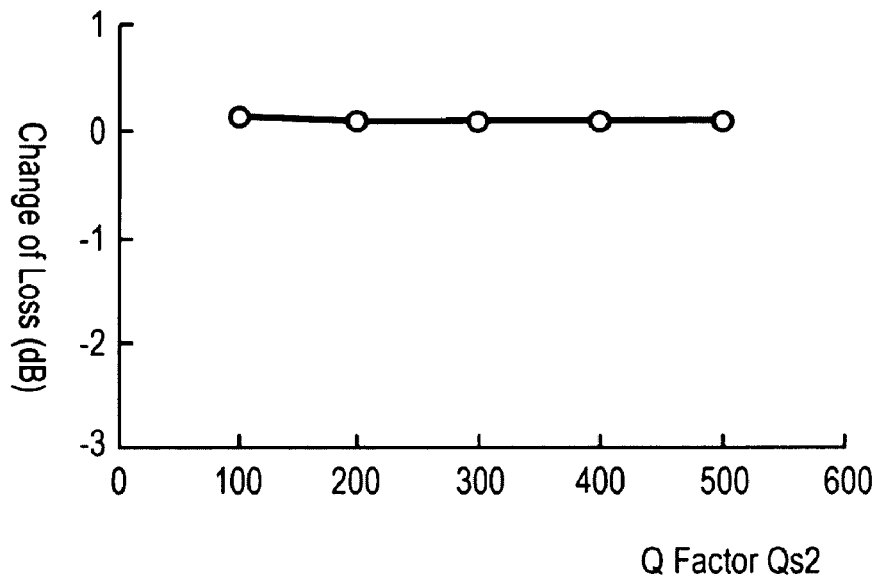
FIG. 5 shows characteristics of a parallel resonator of the surface acoustic wave filter according to the embodiment.

FIG. 5 shows the relation between Q factor Qs2 of parallel resonators 8A and 8B at the resonance frequency and the loss of surface acoustic wave filter 1001. In FIG. 5, the vertical axis represents the change of the loss. The loss at Q factor Qs2 of 500 is determined as a reference loss, and the change of the loss is indicated as a ratio to the reference loss.

As shown in FIG. 5, Q factor Qs2 of parallel resonators 8A and 8B at the resonance frequency does not affect the loss of surface acoustic wave filter 1001 very much.

Figure 6:
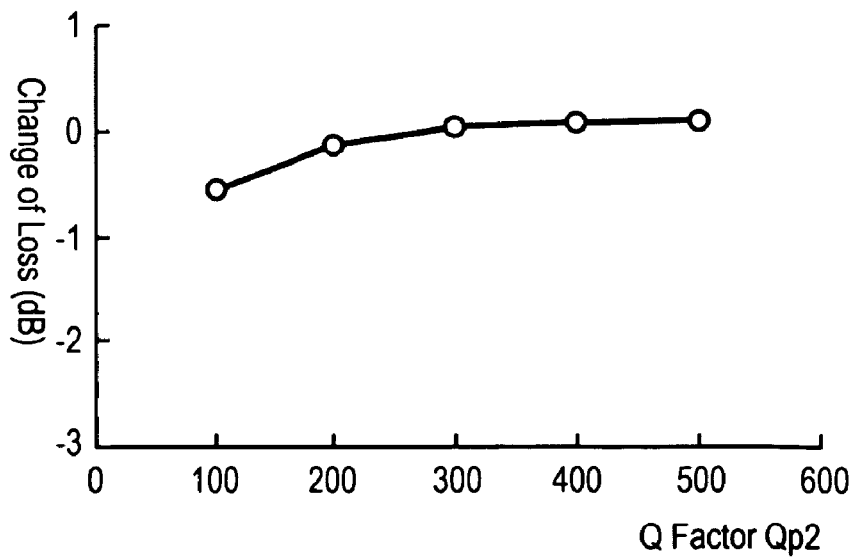
FIG. 6 shows characteristics of the parallel resonator of the surface acoustic wave filter according to the embodiment.

FIG. 6 shows the relation between Q factor Qp2 of parallel resonators 8A and 8B at the anti-resonance frequency and the loss of surface acoustic wave filter 1001. In FIG. 6, the vertical axis represents the change of the loss. The loss at Q factor Qp2 of 500 is determined as a reference loss, and the change of the loss is indicated as a ratio to the reference loss.

As shown in FIG. 6, the loss of the surface acoustic wave filter increases according to the decreasing of Q factor Qp2 of parallel resonators 8A and 8B at the anti-resonance frequency from 500 to 100.

FIGS. 3 to 6 indicate that, in order to reduce the loss of surface acoustic wave filter 1001 at the resonance frequency and the anti-resonance frequency, it is necessary to increase Q factor Qs1 of series resonators 7A, 7B, and 7C at the resonance frequency and Q factor Qp2 of parallel resonators 8A and 8B at the anti-resonance frequency.

Figure 7:
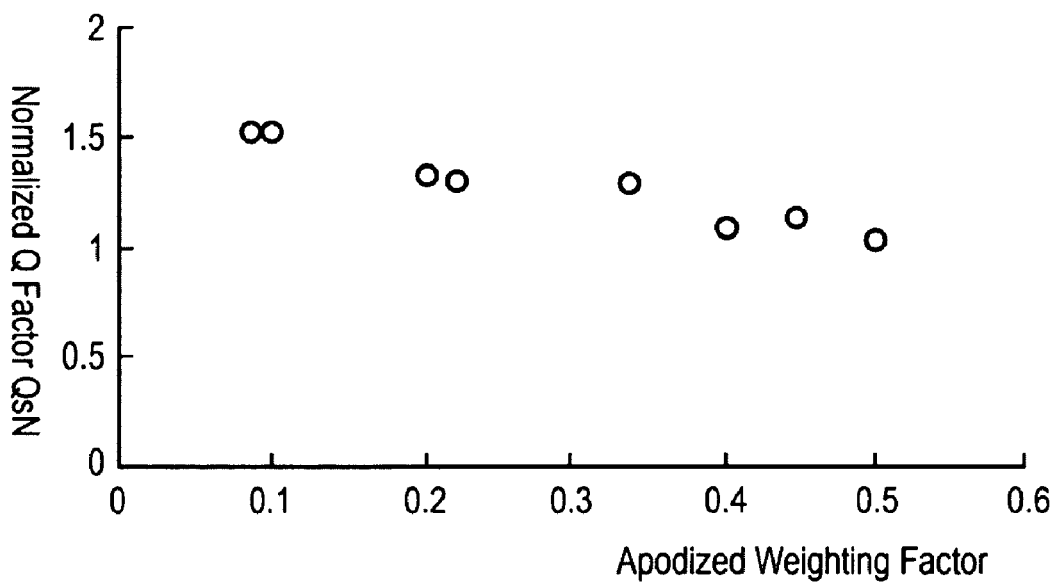
FIG. 7 shows the relation between an apodized weighting factor and a Q factor of the surface acoustic wave filter of the embodiment.

FIG. 7 shows the relation between the apodized weighting factor of resonators 7A to 7C, 8A, and 8B and Q factors Qs1 and Qs2 at the resonance frequency. In FIG. 7, the vertical axis represents Q factors Qs1 and Qs2 as normalized Q factor QsN. Normalized Q factor QsN indicates each of the ratios of Q factors Qs1 and Qs2 at the respective apodized weighting factors to Q factors Qs1 and Qs2 at the apodized weighting factor of 0.5, respectively.

As shown in FIG. 7, normalized Q factor QsN, i.e., Q factors Qs1 and Qs2, decreases according to the increasing of the apodized weighting factor. In view of the relation between Q factor Qs1 of series resonators 7A to 7C and the loss shown in FIG. 3, the apodized weighting factor of series resonators 7A to 7C is as small as possible to increase Q factor Qs1, thereby reducing the loss at the resonance frequency.

Figure 8:
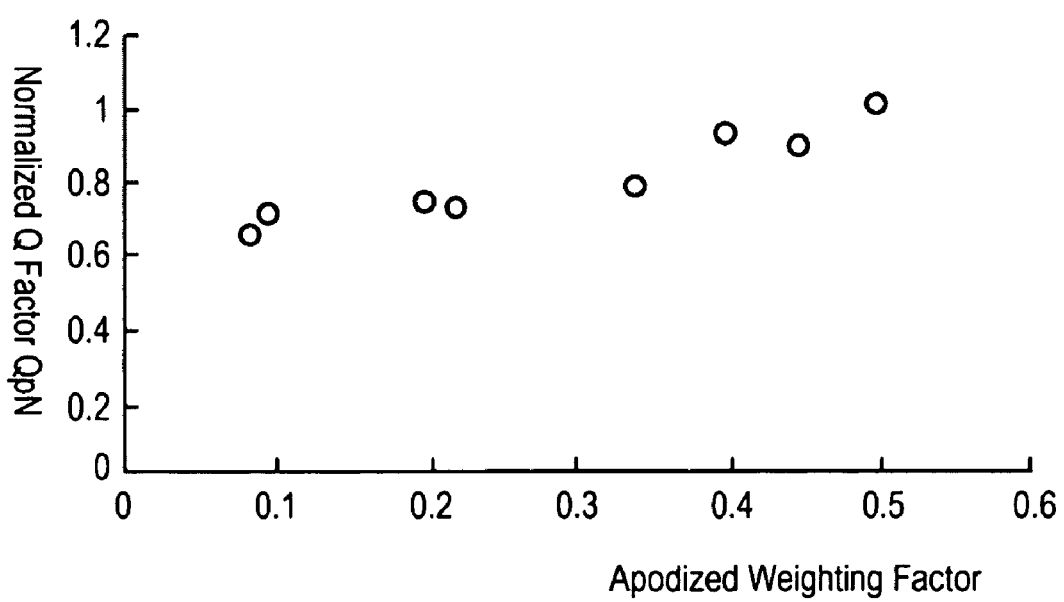
FIG. 8 shows the relation between an apodized weighting factor and a Q factor of the surface acoustic wave filter of the embodiment.

FIG. 8 shows the relation between the apodized weighting factor of resonators 7A to 7C, 8A, and 8B and Q factors Qp1 and Qp2 at the anti-resonance frequency. In FIG. 8, the vertical axis represents Q factors Qp1 and Qp2 as normalized Q factor QpN. Normalized Q factor QpN is the ratio of each of Q factors Qp1 and Qp2 at the respective apodized weighting factors to Q factors Qp1 and Qp2 at the apodized weighting factor of 0.5, respectively.

As shown in FIG. 8, normalized Q factor QpN, i.e., Q factors Qp1 and Qp2, increases according to the increasing of the apodized weighting factor. In view of the relation between Q factor Qp2 of parallel resonators 8A, 8B and the loss shown in FIG. 6, the apodized weighting factor of parallel resonators 8A and 8B is as large as possible and as close to 0.5 as possible to increase Q factor Qp2, thereby reducing the loss at the anti-resonance frequency.

As shown in FIGS. 7 and 8, the apodized weighting factor of interdigital transducer electrode 10 of each of series resonators 7A, 7B, and 7C is smaller than the apodized weighting factor of interdigital transducer electrode 12 of each of parallel resonators 8A and 8B. This arrangement allows series resonators 7A, 7B, and 7C to have a high Q factor at the resonance frequency while allowing parallel resonators 8A and 8B to maintain a high Q factor at the anti-resonance frequency, accordingly reducing the loss in the transmission characteristics of surface acoustic wave filter 1001.

Figure 9:
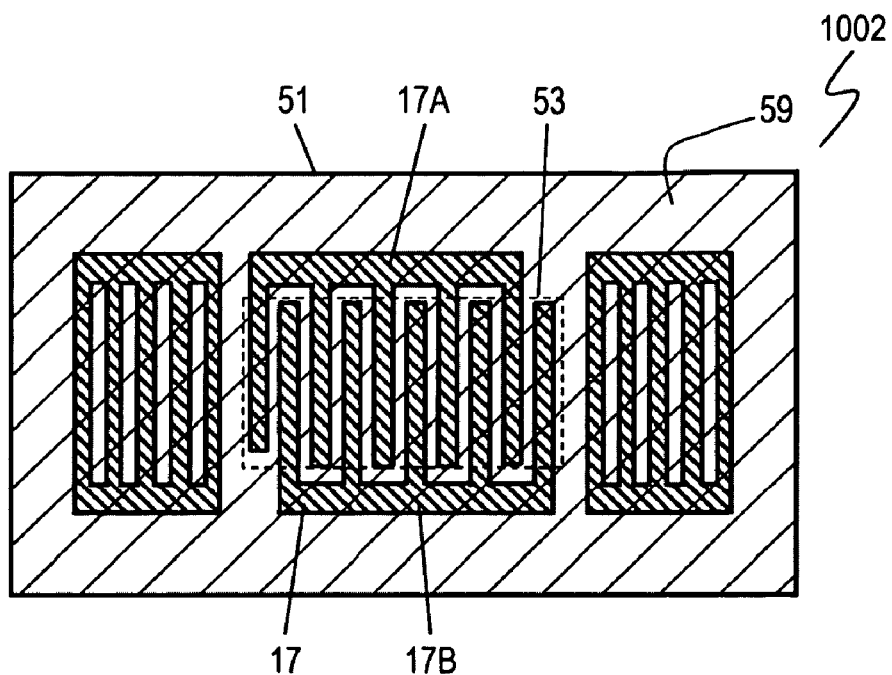
FIG. 9 is a top view of a resonator of a surface acoustic wave filter as a comparative example.

The apodized weighting factor is also related to the reducing of spurious of a transverse mode. FIG. 9 is a top view of surface acoustic wave resonator 51 as a comparative example. Surface acoustic wave resonator 51 includes piezoelectric substrate 59 and interdigital transducer electrode 17 provided on substrate 59. Piezoelectric substrate 59 is made of the same material as piezoelectric substrate 9. Interdigital transducer electrode 17 includes comb electrodes 17A and 17B provided on piezoelectric substrate 59. In excitation region 53 of interdigital transducer electrode 17, the area of an electrode non-facing region in which the electrode fingers of comb electrodes 17A and 17B are not positioned interdigitally with each other is zero. In other words, the apodized weighting factor is zero.

Figure 10:
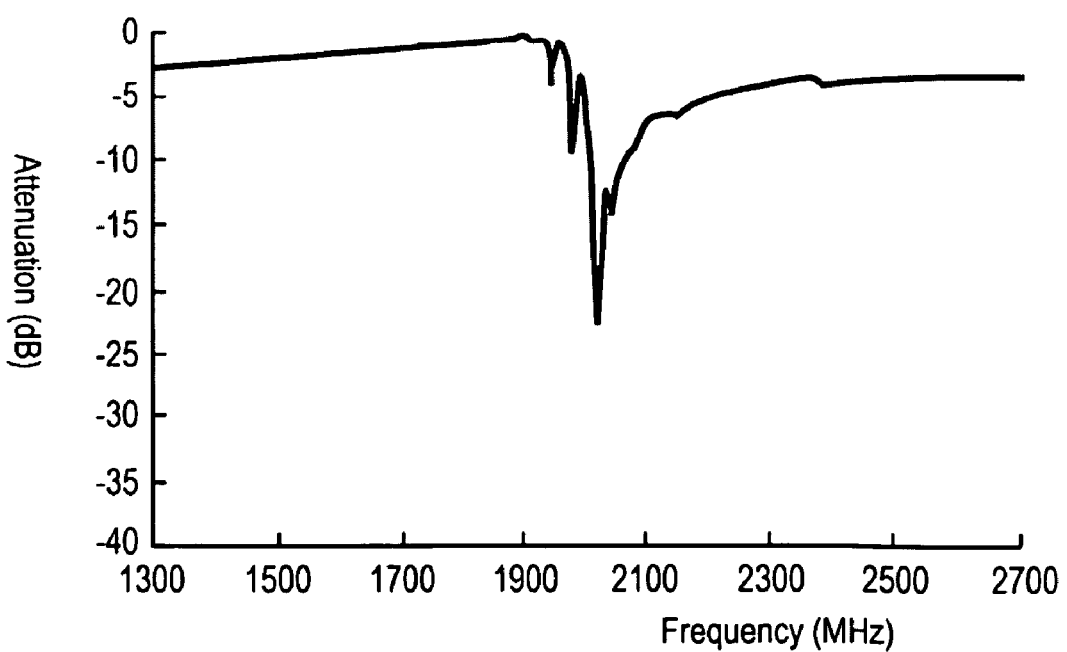
FIG. 10 shows transmission characteristics of the surface acoustic wave filter shown in FIG. 9.

FIG. 10 shows transmission characteristics of resonator 51. Interdigital transducer electrode 17 is provided over an SiO$_2$ thin layer having a thickness not less than 15% of the wavelength of a surface acoustic wave propagating through excitation region 53. As shown in FIG. 10, surface acoustic wave resonator 51 produces spurious of a transverse mode at frequencies ranging from 1900 MHz to 2100 MHz.

Figure 11:
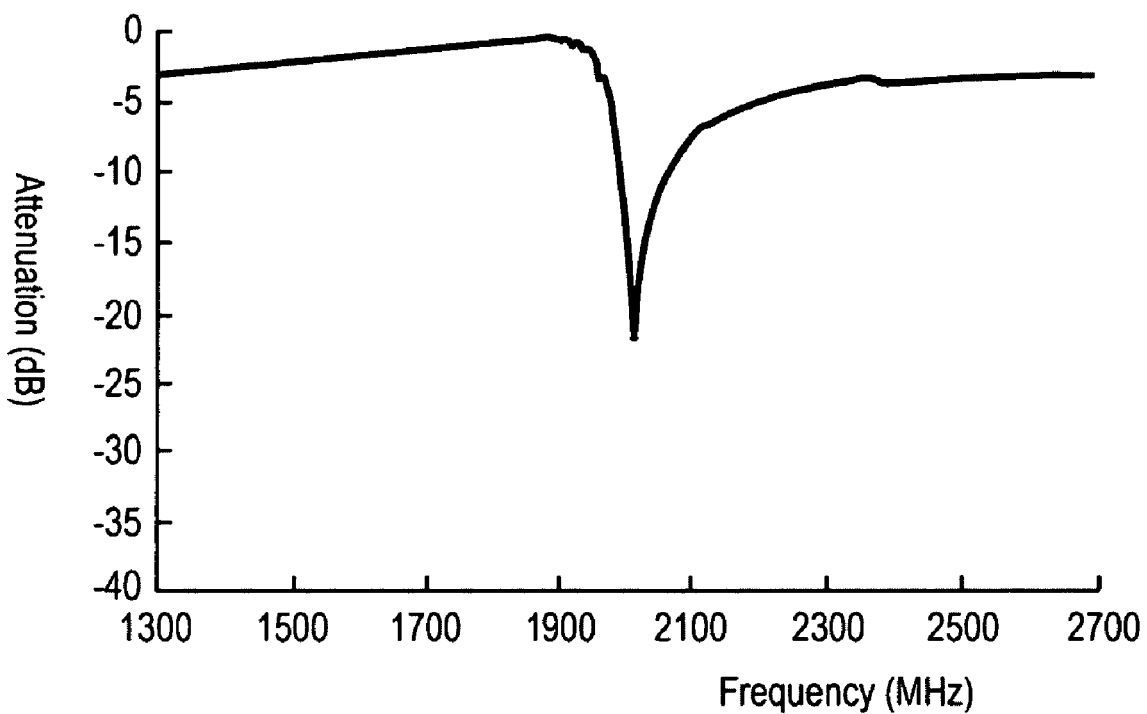
FIG. 11 shows transmission characteristics of the surface acoustic wave filter according to the embodiment.

FIG. 11 shows transmission characteristics of a surface acoustic wave filter including an interdigital transducer electrode having an apodized weighting factor of 0.225. As shown in FIG. 11, this surface acoustic wave filter is prevented from allowing the spurious of the transverse mode at frequencies ranging from 1900 MHz to 2100 MHz.

Thus, the apodized weighting factor of interdigital transducer electrode 10 of series resonators 7A to 7C shown in FIG. 2 is determined to be larger than zero to prevent the spurious.

The apodized weighting factor of interdigital transducer electrode 12 of parallel resonators 8A and 8B is preferably not smaller than 0.5. This reduces the spurious of the transverse mode and increases the Q factor of parallel resonators 8A and 8B at the anti-resonance frequency, thereby reducing the loss of transmission characteristics of surface acoustic wave filter 1001.

Piezoelectric substrate 9 is preferably made of −30° to +30° rotated Y-cut lithium niobate. Cut angles within this range provides surface acoustic wave filter 1001 with a wide bandwidth.

Figure 12:
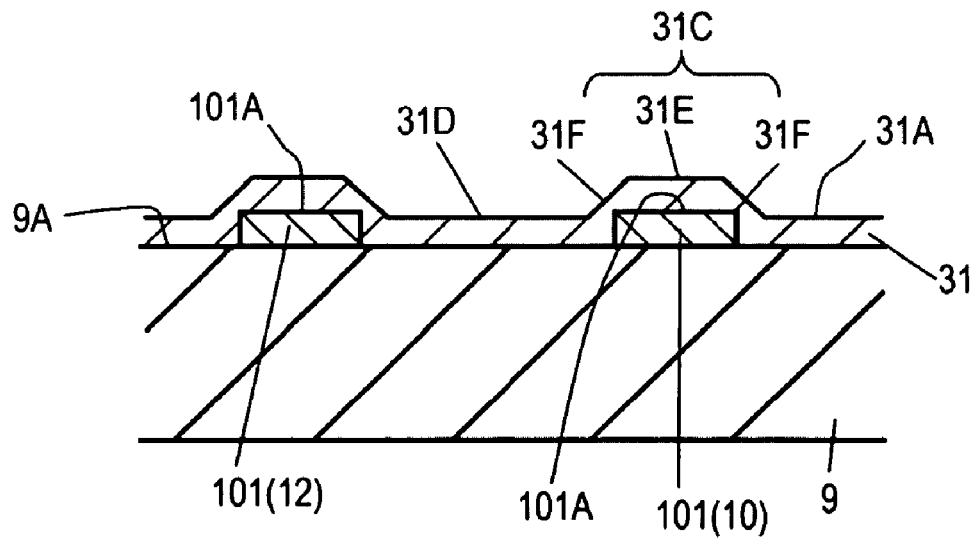
FIG. 12 is a sectional view of the surface acoustic wave filter according to the embodiment.

FIG. 12 is a sectional view of surface acoustic wave filter 1001. Electrode fingers 101 of interdigital transducer electrodes 10 and 12 may be covered with dielectric layer 31. Dielectric layer 31 is provided on upper surface 9A of piezoelectric substrate 9 and upper surfaces 101A of electrode fingers 101. Dielectric layer 31 may be preferably made of SiO$_2$ and have a thickness not less than 15% of the wavelength of the surface acoustic wave which propagates through the excitation region, thereby reducing the loss of the surface acoustic wave and improving temperature characteristics.

Dielectric layer 31 has upper surface 31A including projection 31C and flat portion 31D. Projection 31C covers electrode finger 101 along finger 101. Flat portion 31D is connected with projection 31C and provided on upper surface 9A of piezoelectric substrate 9. Projection 31C has upper surface 31E located directly above electrode finger 101 and slanting portion 31F extending slantingly from upper surface 31E to flat portion 31D and flat portion 31A. Upper surface 31E is parallel to upper surface 101A of electrode finger 101. Upper surface 31E of projection 31C have a width smaller than that of upper surfaces 101A of electrode fingers 101, thereby reducing spurious caused by Rayleigh waves.

Interdigital transducer electrodes 10 and 12 are made of material, such as Al or Cu, having a high conductivity. Interdigital transducer electrodes 10 and 12 are made of heavy material, such as Au, Ag, or Cu, to have so large weights that the surface acoustic wave can be confined in piezoelectric substrate 9, thereby reducing the loss of surface acoustic wave filter 1001.

Figure 13:
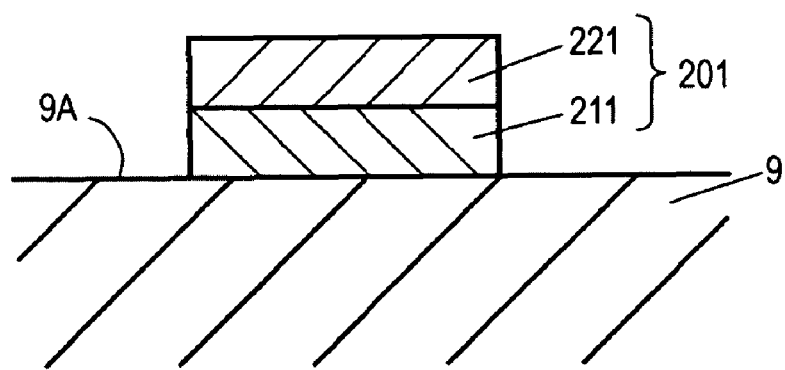
FIG. 13 is a sectional view of another electrode of the surface acoustic wave filter according to the embodiment.

FIG. 13 is a sectional view of another interdigital transducer electrode 201 of surface acoustic wave filter 1001. Interdigital transducer electrode 201 includes lower layer 211 provided on upper surface 9A of piezoelectric substrate 9 and upper layer 221 provided on lower layer 211. Lower layer 211 is made of Ti. Upper layer 221 is made of Al-based alloy. This electrode can improve withstanding characteristics of surface acoustic wave filter 1001 against high power.

Figure 14:
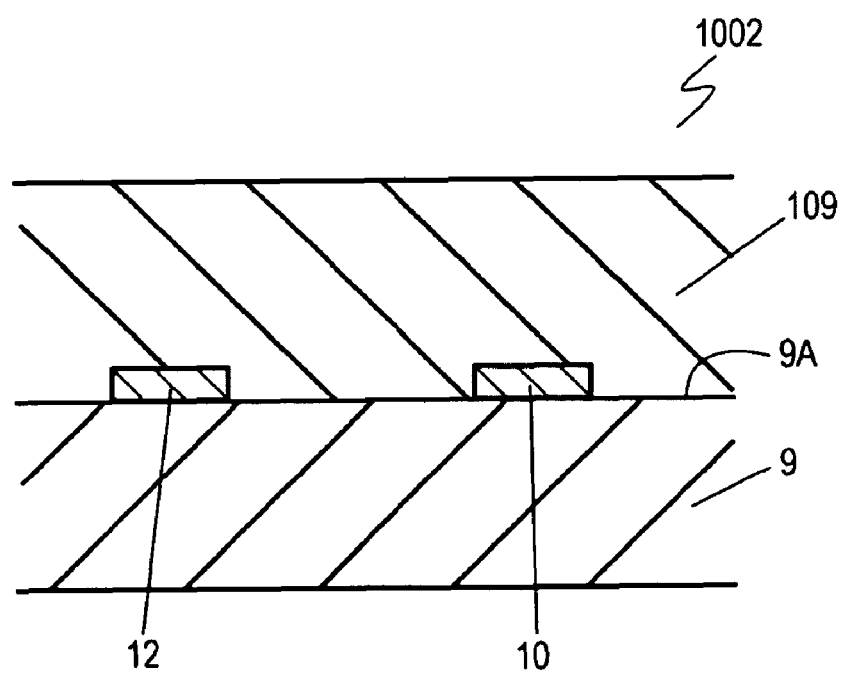
FIG. 14 is a sectional view of a boundary acoustic wave filter according to the embodiment.

FIG. 14 is a sectional view of boundary acoustic wave filter 1002 according to the embodiment. Boundary acoustic wave filter 1002 further includes medium layer 109 provided on upper surface 9A of piezoelectric substrate 9 and on interdigital transducer electrodes 10 and 12 of surface acoustic wave filter 1001 shown in FIG. 2. A propagation speed of transverse waves through medium layer 109 is lower than that of transverse waves in piezoelectric substrate 9. This arrangement causes acoustic waves to be confined on the boundary between piezoelectric substrate 9 and medium layer 109. If piezoelectric substrate 9 is made of lithium niobate, medium layer 109 is made of $SiO_2$. Thereby, the boundary acoustic wave filter with excellent temperature characteristics is provided.

Figure 15:
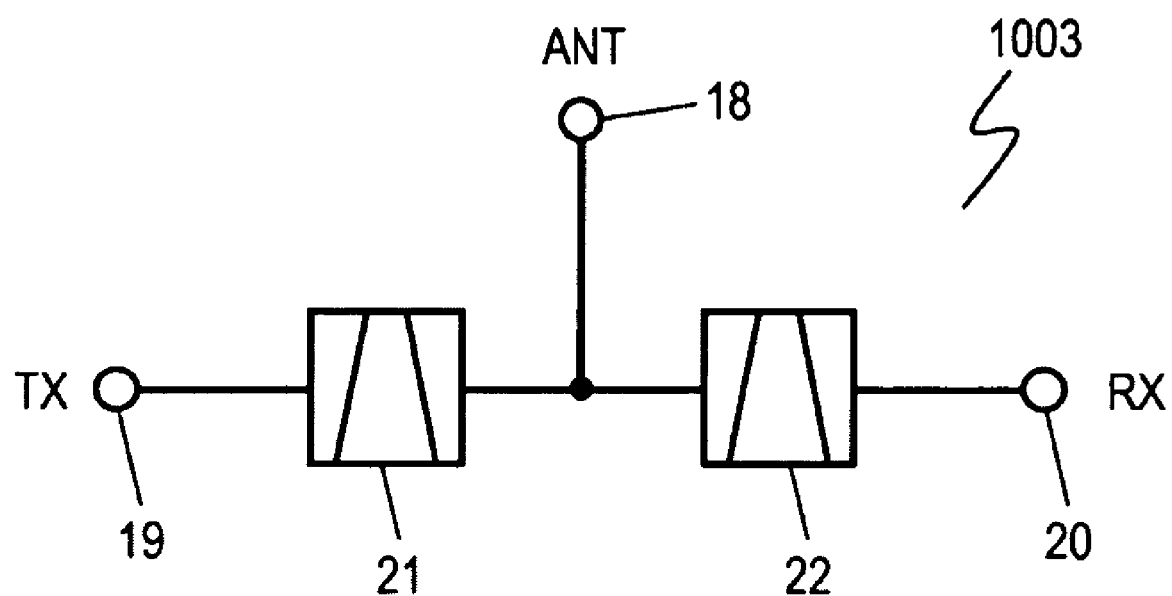
FIG. 15 is a circuit diagram of an antenna duplexer according to the embodiment.

FIG. 15 is a circuit diagram of antenna duplexer 1003 according to the embodiment. Antenna duplexer 1003 includes antenna terminal 18 arranged to be connected to an antenna, transmitting terminal 19 arranged to connected to a transmitting circuit, receiving terminal 20 arranged to be connected to an receiving circuit, transmitting filter 21, and receiving filter 22. Transmitting filter 21 is connected between antenna terminal 18 and transmitting terminal 19. Receiving filter 22 is connected between antenna terminal 18 and receiving terminal 20. At least one of transmitting filter 21 and receiving filter 22 is surface acoustic wave filter 1001 or boundary acoustic wave filter 1002, providing antenna duplexer 1002 with low loss.

Surface acoustic wave filter 1001 shown in FIG. 2 includes series resonators 7A to 7C and parallel resonators 8A and 8B on single piezoelectric substrate 9. According to the embodiment, series resonators 7A to 7C may be formed on a piezoelectric substrate different from the piezoelectric substrate having parallel resonators 8A and 8B formed thereon.

Surface acoustic wave filter 1001 includes three series resonators 7A to 7C and two parallel resonators 8A and 8B. Alternatively, the surface acoustic wave filter may include at least one series resonator and at least one parallel resonator, having the same effects to reducing loss.

Figure 16A:
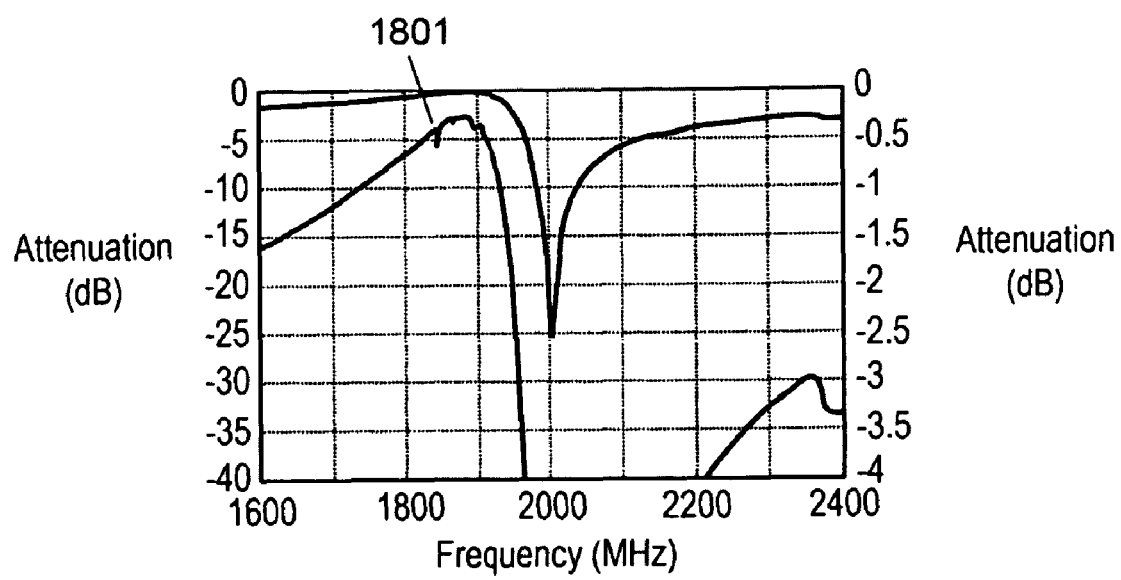
FIGS. 16A and 16B show transmission characteristics and an admittance of the surface acoustic wave resonator according to the embodiment, respectively.
Figure 16B:
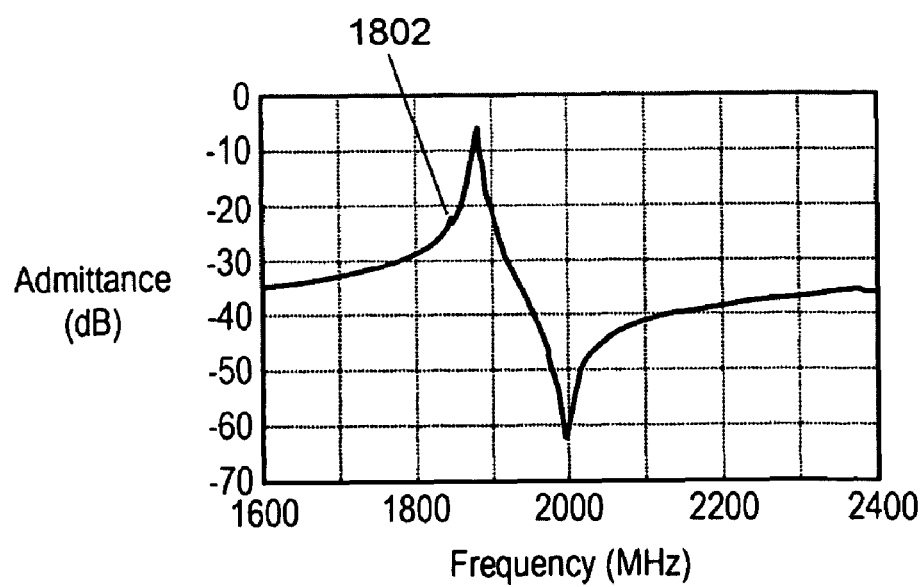

In the surface acoustic wave resonator including the dielectric layer 31 made of $SiO_2$, the interdigital transducer electrodes 11 and 12, and the piezoelectric substrate 9 made of lithium niobate shown in FIG. 12, the apodized weighting factor may be determined to suppress the spurious in the transverse mode, however, the resonator do not suppress a spurious due to a Rayleigh mode may occur in a frequency region lower than the resonance frequency. FIGS. 16A and 16B show transmission characteristics and an admittance of the surface acoustic wave resonator, respectively. The spurious 1801 shown in FIG. 16A has a large level of 0.2 dB, and the spurious 1802 of the admittance shown in FIG. 16B has a large level of 1.0 dB. Upon being utilized in a ladder-type filter and an antenna duplexer, this surface acoustic wave resonator may cause the spurious to have the characteristics deteriorate in the region.

The spurious due to the Rayleigh mode can be suppressed by making a metallization ratio of a surface acoustic wave resonator of a surface acoustic wave filter having a high resonance frequency be larger than a metallization ratio of a surface acoustic wave resonator having a low resonance frequency.

Figure 17A:
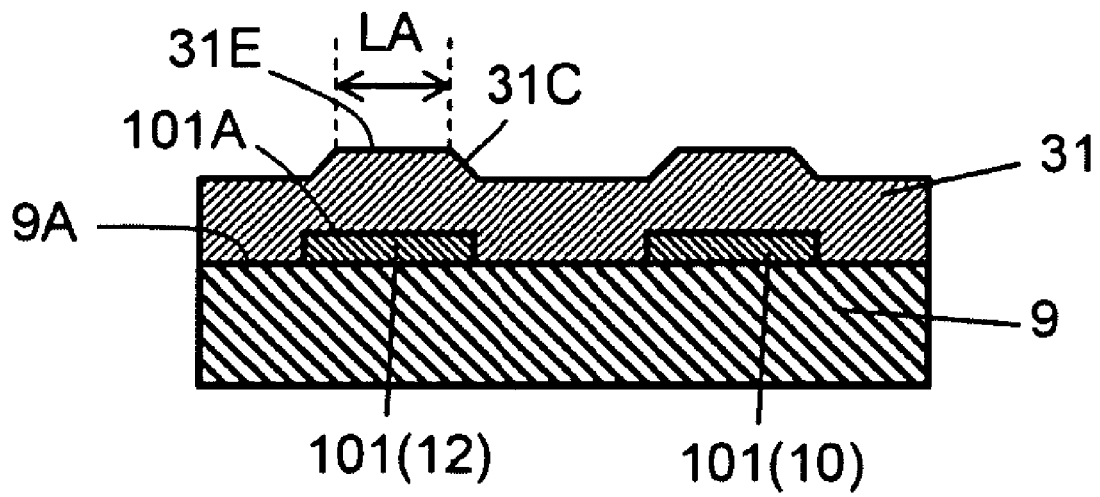
FIGS. 17A and 17B are sectional views of the surface acoustic wave filter according to the embodiment.
Figure 17B:
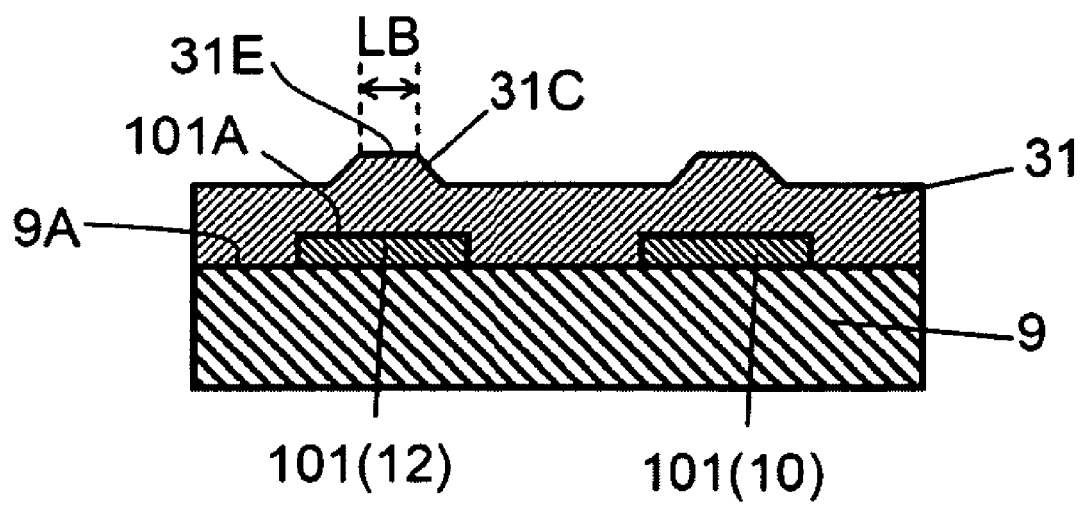

FIGS. 17A and 17B are sectional views of the surface acoustic wave filter 1001. The dielectric layer 31 provided on the upper surface 9A of the piezoelectric substrate 9 and on the upper surface 101A of the electrode finger 101 has a shape along the upper surface 9A of the piezoelectric substrate 9 and the upper surface 101A of the electrode finger 101. The width LB of the upper surface 31E of the projection 31C of the dielectric layer 31 directly above the upper surface 101A of the electrode finger 101 shown in FIG. 17B is smaller than the width LA of the upper surface 31E of the projection 31C of the dielectric layer 31 directly above the upper surface 101A of the electrode finger 101 shown in FIG. 17A. The projection 31C of the dielectric layer 31 may be formed by, for example, applying a bias voltage to the piezoelectric substrate when the dielectric layer 31 is formed. The bias voltage is increased to reduce the width of the upper surface 31E of the projection 31C.

Figure 18A:
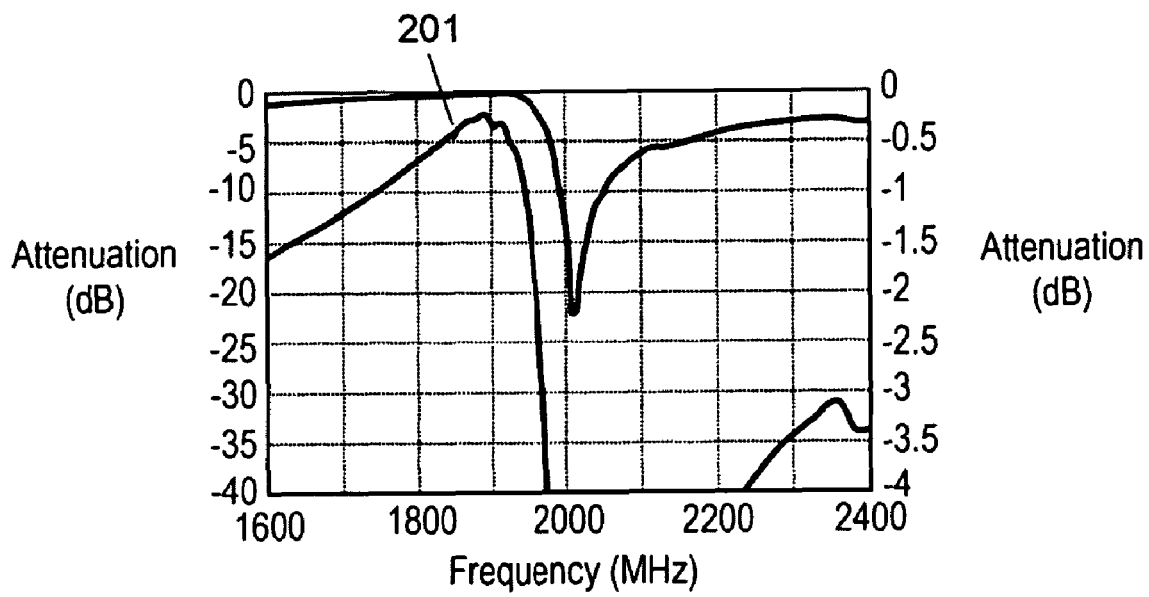
FIGS. 18A and 18B show transmission characteristics and an admittance of the surface acoustic wave resonator according to the embodiment, respectively.
Figure 18B:
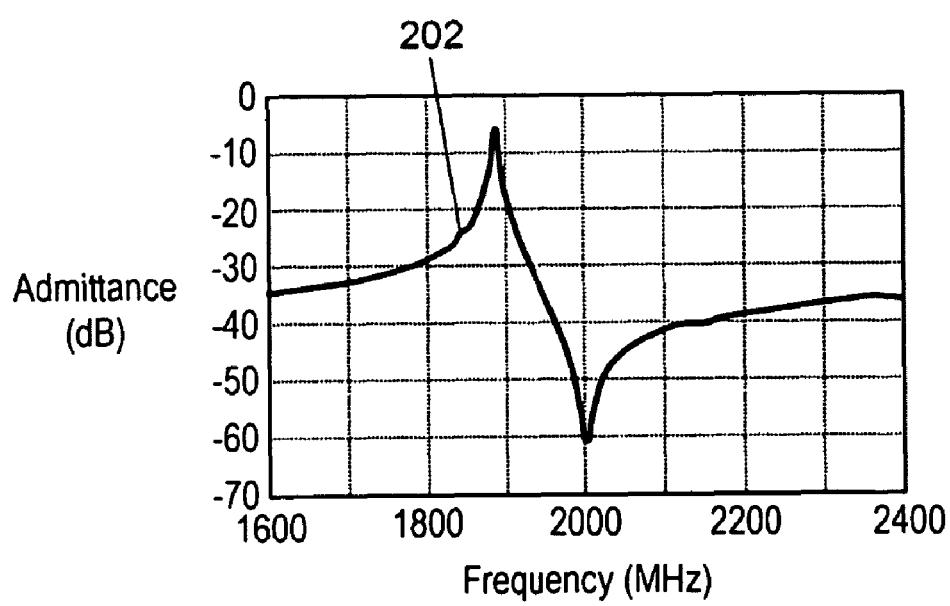

FIGS. 18A and 18B show transmission characteristics and an admittance of the surface acoustic wave resonator having the width LB of the upper surface 31E shown in FIG. 17B. The spurious 201 of the transmission characteristics shown in FIG. 18A is suppressed to 0.05 dB. The spurious 202 of the admittance shown in FIG. 18B is suppressed to 0.1 dB. Thus, the condition for forming the dielectric layer 31 may be controlled to suppress the spurious. However, this method may have characteristics of the resonator slightly deteriorate. In particular, the Q factor at the anti-resonance frequency is reduced from 180 to 120, and the level at the pole of the attenuation deteriorates from 24.5 dB to 22.0 dB. This may cause the transmission loss to deteriorate if the surface acoustic wave resonator is used as the parallel resonator of the ladder-type surface acoustic wave filter.

Figure 19:
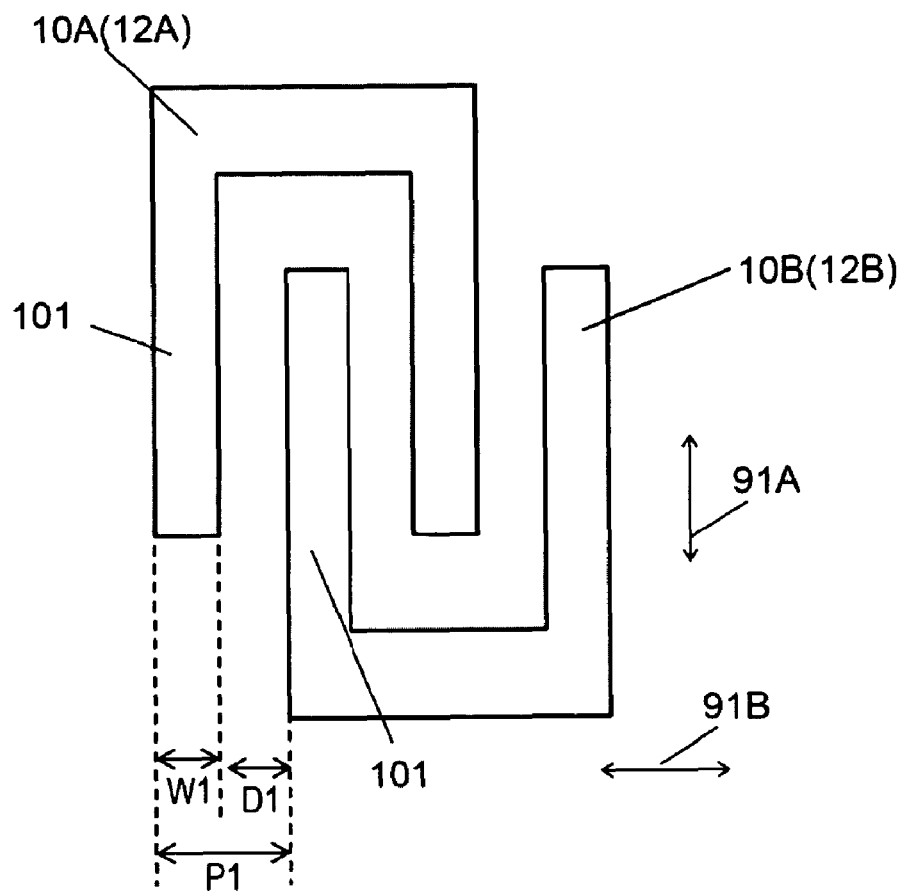
FIG. 19 is an enlarged plan view of the surface acoustic wave resonator according to the embodiment.

The characteristics of the resonator depending on the metallization ratio of the comb electrodes were evaluated. FIG. 19 is an enlarged plan view of each of the surface acoustic wave resonators 7A to 7C shown in FIG. 2. The comb electrodes 10A and 10B (12A and 12B) facing each other have the electrode fingers 101 extending in a direction 91A. The electrode fingers 101 faces in a direction 91B perpendicular to the direction 91A. The metallization ratio $\eta$ and a pitch P1 are defined on the width W1 of the finger 101 and the distance D1 between the fingers 101 in the direction 91B as follows.

$P1 = W1 + D1$ $\eta = W1/P1$

Figure 20:
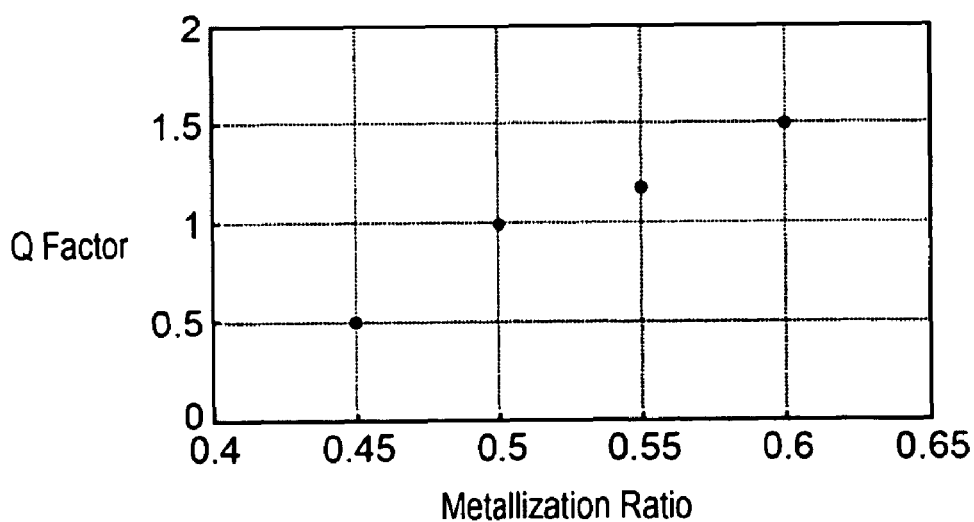
FIG. 20 shows the relation between a Q factor and a metallization ratio of the surface acoustic wave resonator according to the embodiment.
Figure 21A:
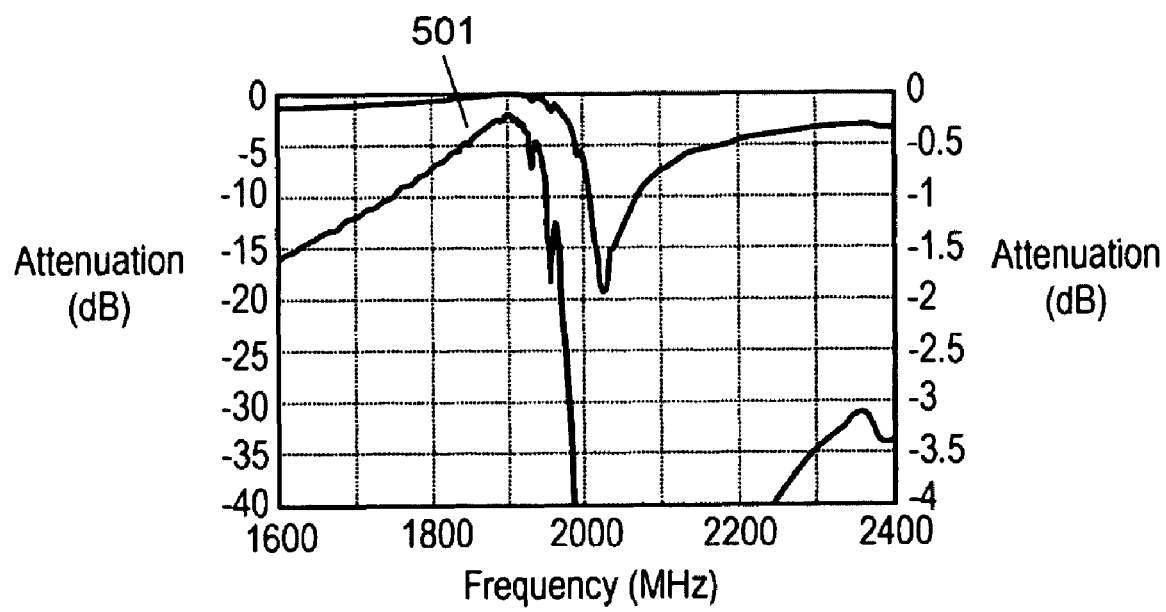
FIGS. 21A and 21B show transmission characteristics and an admittance of the surface acoustic wave resonator according to the embodiment, respectively.
Figure 21B:
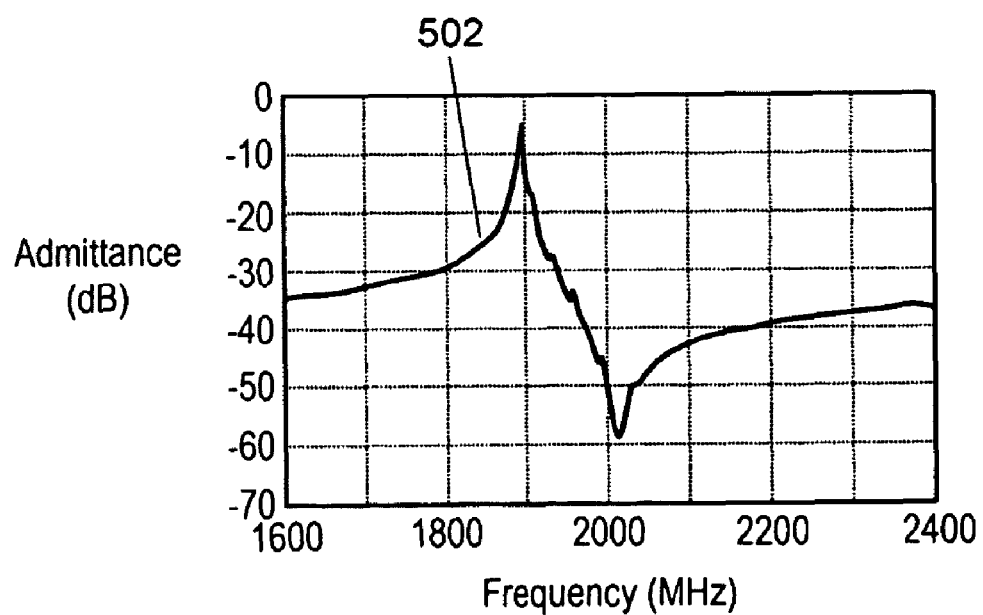
Figure 22A:
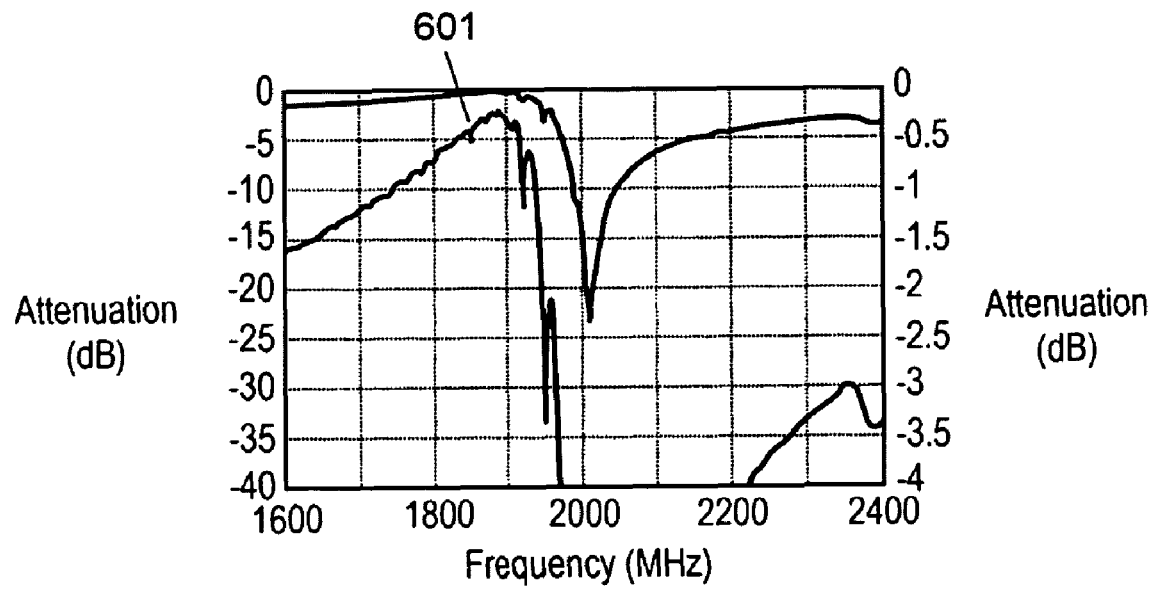
FIGS. 22 and 22B show transmission characteristics and an admittance of the surface acoustic wave resonator according to the embodiment, respectively.
Figure 22B:
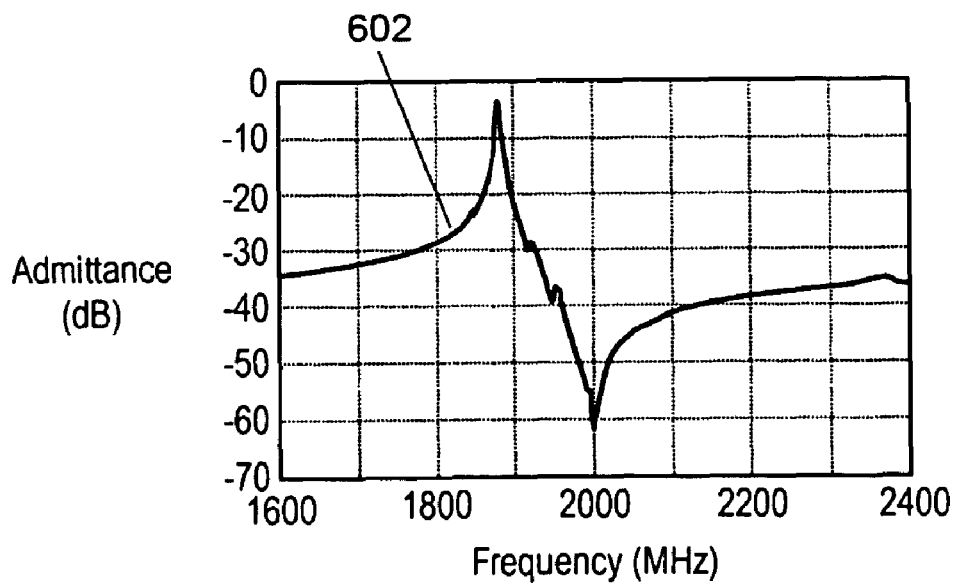
Figure 23A:
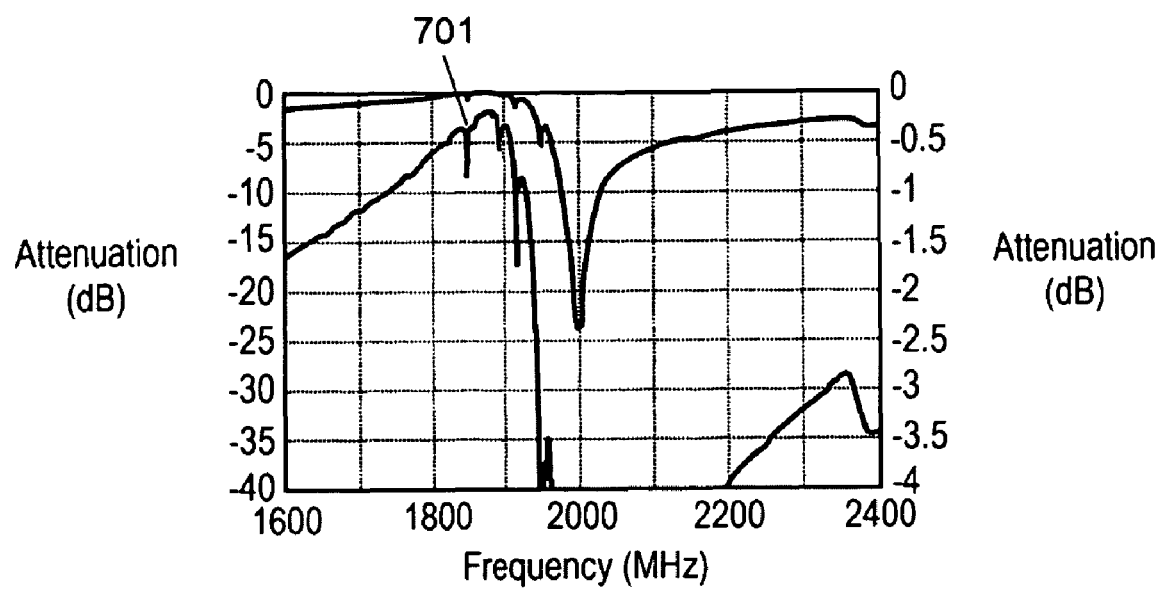
FIGS. 23A and 23B show transmission characteristics and an admittance of the surface acoustic wave resonator according to the embodiment, respectively.
Figure 23B:
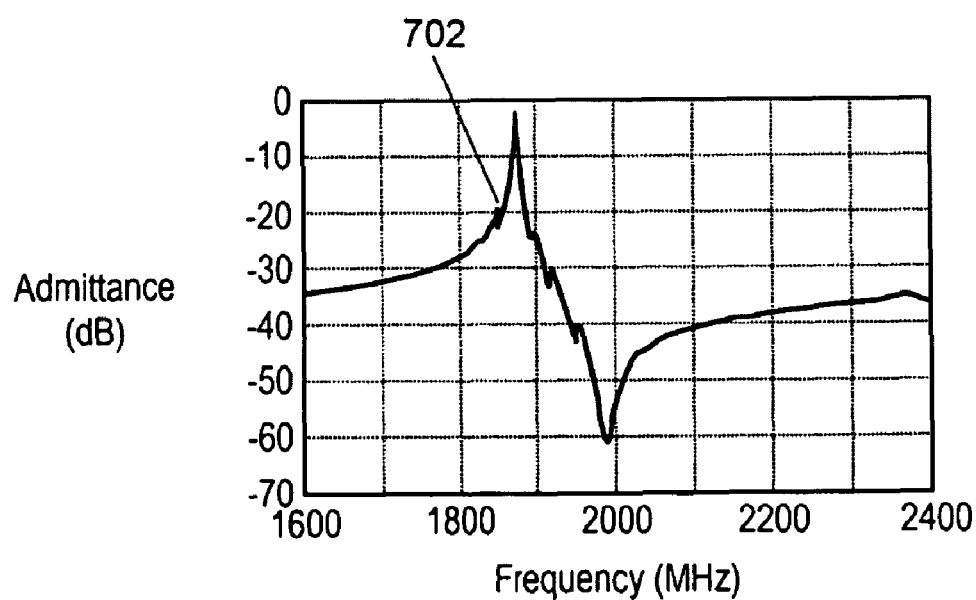
Figure 24A:
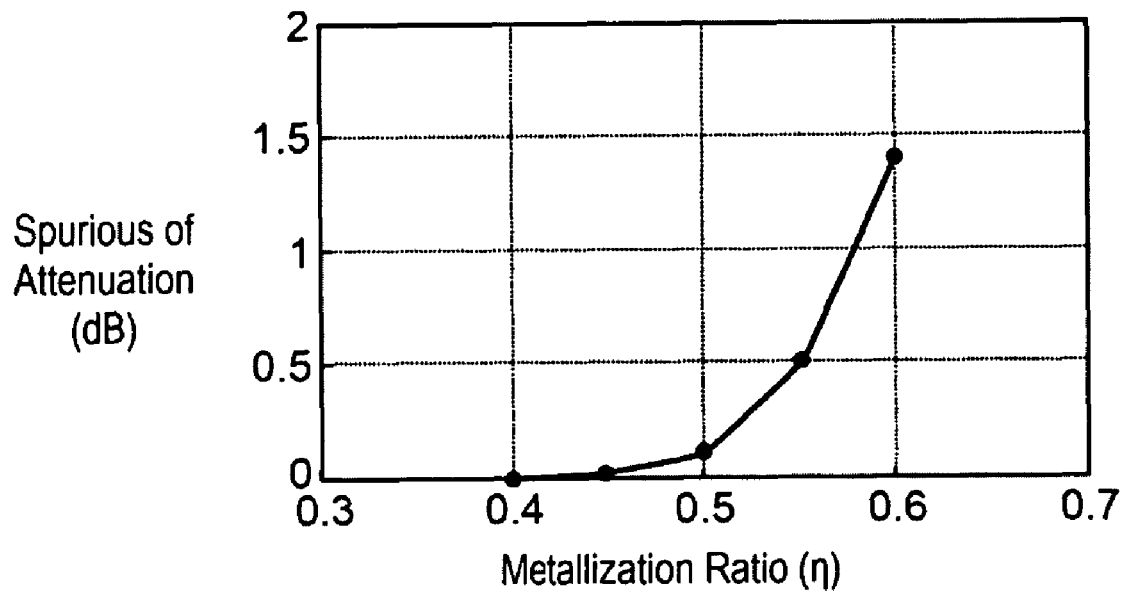
FIG. 24A shows the relation between the metallization ratio and a spurious of the transmission characteristics of the surface acoustic wave resonator according to the embodiment.
Figure 24B:
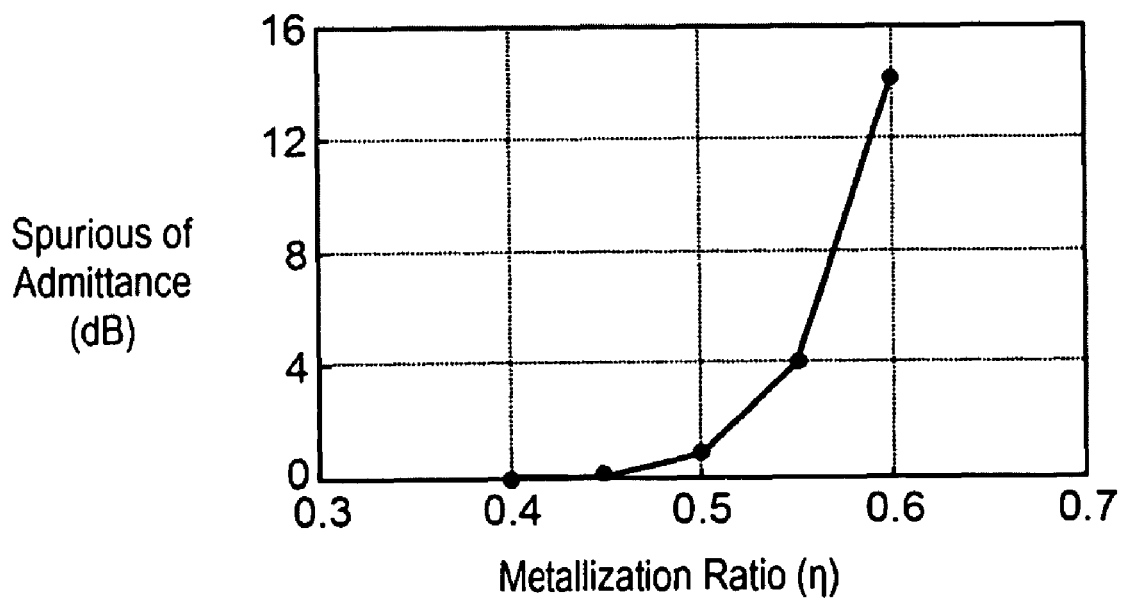
FIG. 24B shows the relation between the metallization ratio and a spurious of the admittance of the surface acoustic wave resonator according to the embodiment.

FIG. 20 shows the relation between the Q factor at the anti-resonance frequency and the metallization ratio $\eta$ of the resonator. In FIG. 20, the vertical axis represents the Q factor which is normalized on the Q factor at the metallization ratio $\eta$ of 0.50. As shown in FIG. 20, the Q factor increases as the metallization ratio $\eta$ increases. FIGS. 21A and 21B show transmission characteristics and an admittance at $\eta=0.45$, respectively. FIGS. 22A and 22B show transmission characteristics and an admittance at $\eta=0.50$, respectively. FIGS. 23A and 23B show transmission characteristics and an admittance at $\eta=0.55$, respectively. The pitch P1 is 1.00 μm. Piezoelectric substrate 9 is made of 5° rotated Y-cut lithium niobate. The ratio of the thickness of the comb electrodes 10A and 10B (12A and 12B) to the wavelength of the acoustic wave propagating on the piezoelectric substrate 9 is 8%. The ratio of the dielectric layer 31 to the wavelength of the acoustic wave is 10%. The comb electrodes 10A and 10B (12A and 12B) essentially contains aluminum. The spurious in a frequency region higher than the resonance frequency is caused in the transverse mode, and is suppressed by adjusting the apodized weighting factor. Spurious 501, 502, 601, 602, 701, and 702 in the frequency region lower than the resonance frequency increases as the metallization ratio 11 increases. FIG. 24A shows the relationship between the metallization ratio $\eta$ and the spurious of the transmission characteristics. FIG. 24B shows the relationship between the metallization ratio $\eta$ and the spurious of the admittance. As shown in FIGS. 24A and 24B, the spurious increases as the metallization ratio η increases. Thus, if the metallization ratio η increases, the Q factor and the level at the attenuation pole are improved, however, the spurious increases. In other words, in that case that the metallization ratio η is small, the bias voltage applied at the forming of the dielectric layer 31 may be reduced, accordingly improving the characteristics.

Figure 25A:
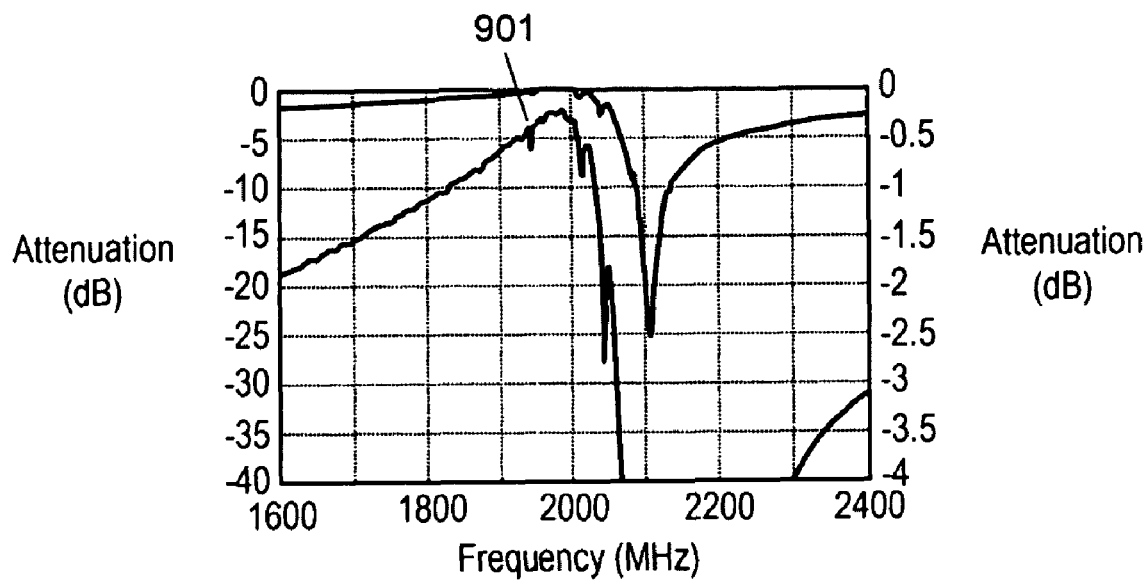
FIGS. 25A and 25B show transmission characteristics and an admittance of the surface acoustic wave resonator according to the embodiment, respectively.
Figure 25B:
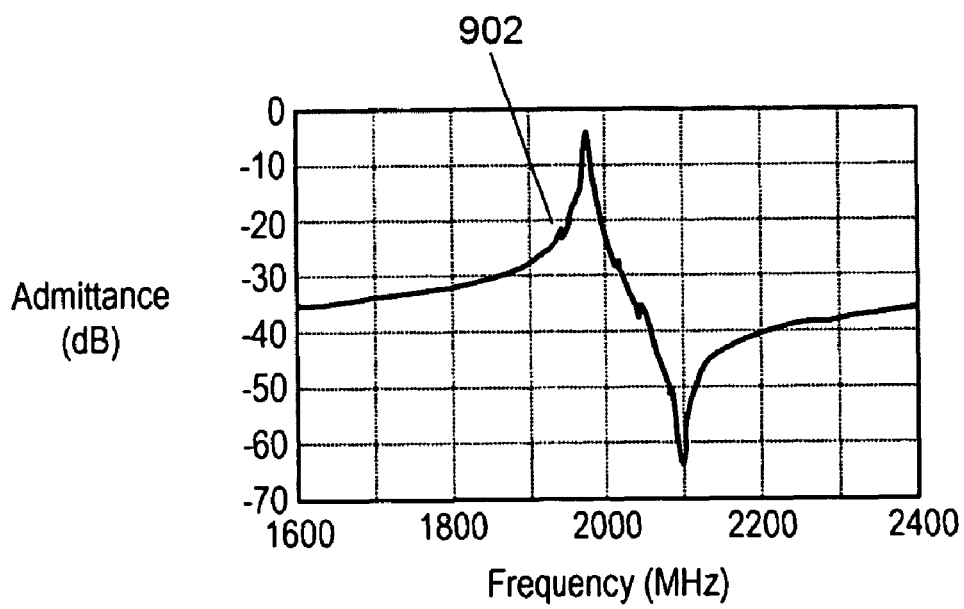
Figure 26A:
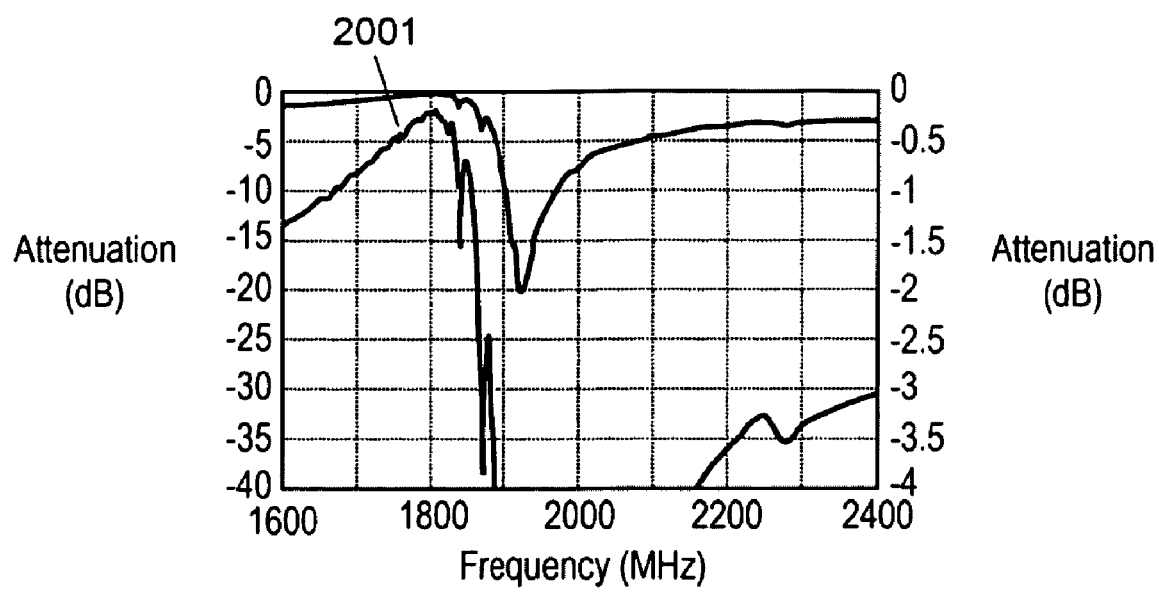
FIGS. 26A and 26B show transmission characteristics and an admittance of the surface acoustic wave resonator according to the embodiment, respectively.
Figure 26B:
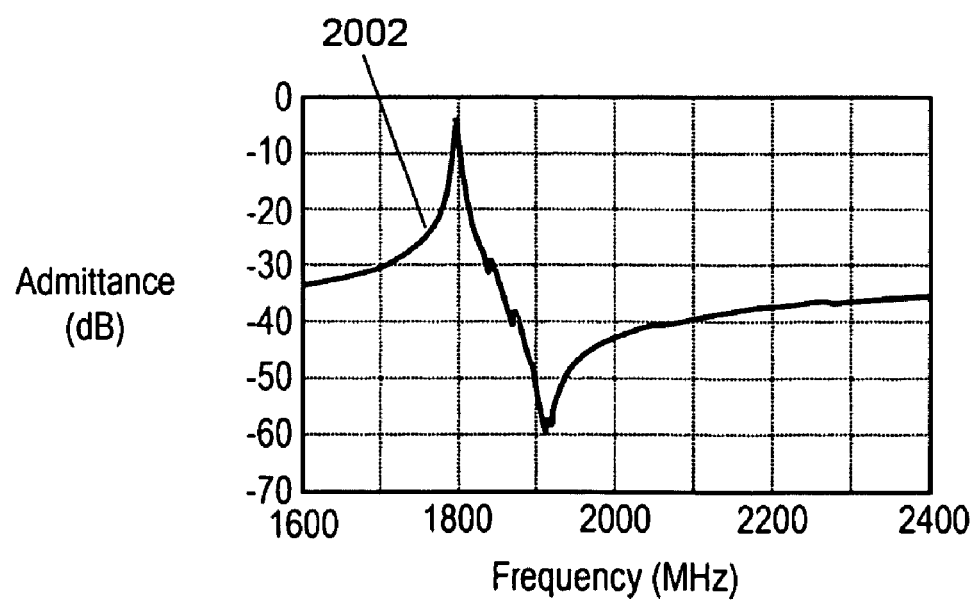
Figure 27A:
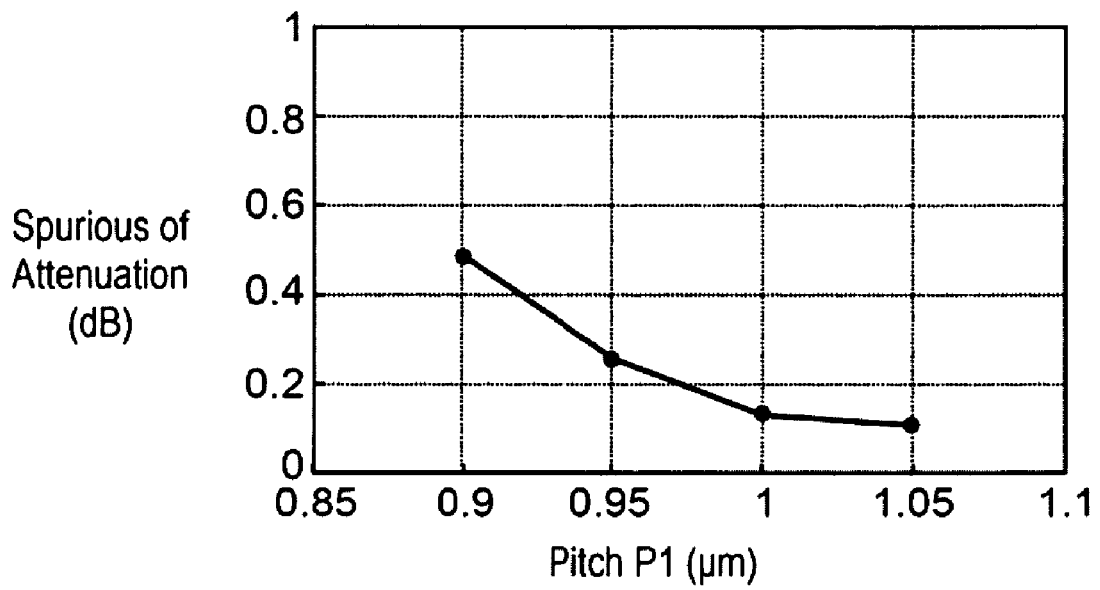
FIGS. 27A and 27B show transmission characteristics and an admittance of the surface acoustic wave resonator according to the embodiment, respectively.
Figure 27B:
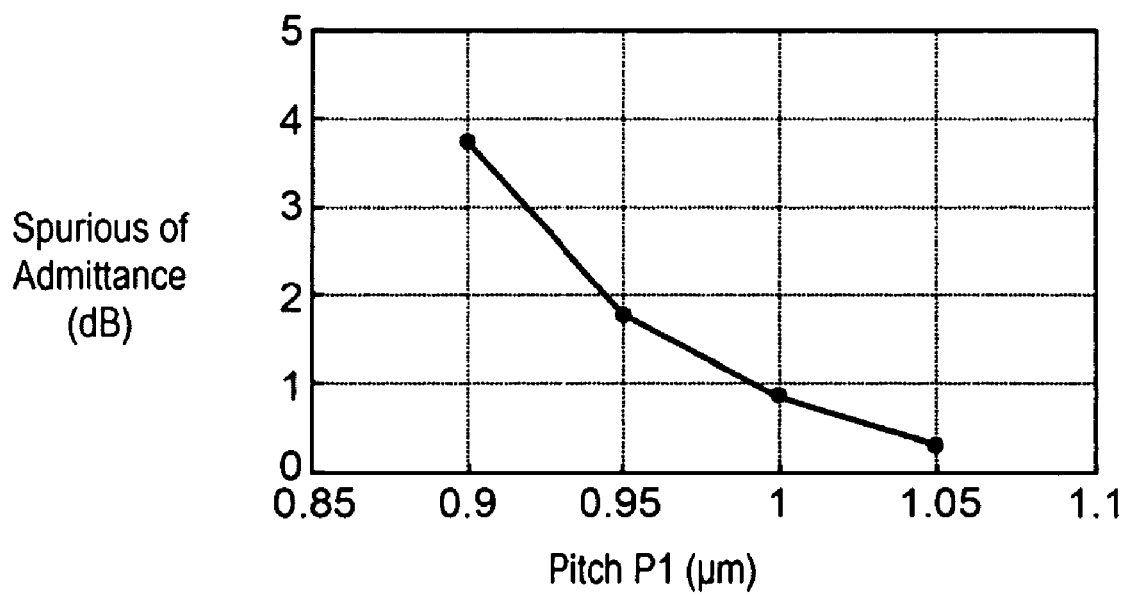
Figure 28:
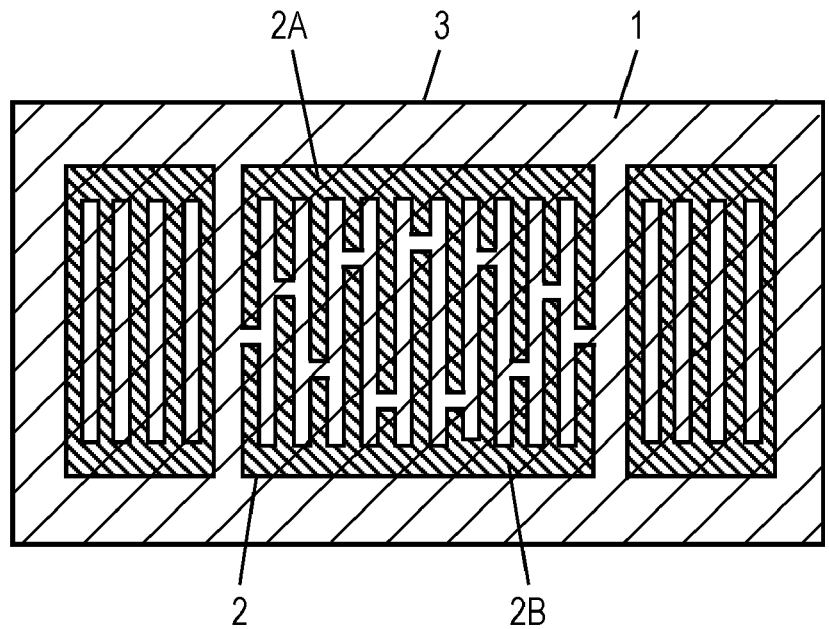
FIG. 28 is a top view of a conventional surface acoustic wave filter.
Figure 29:
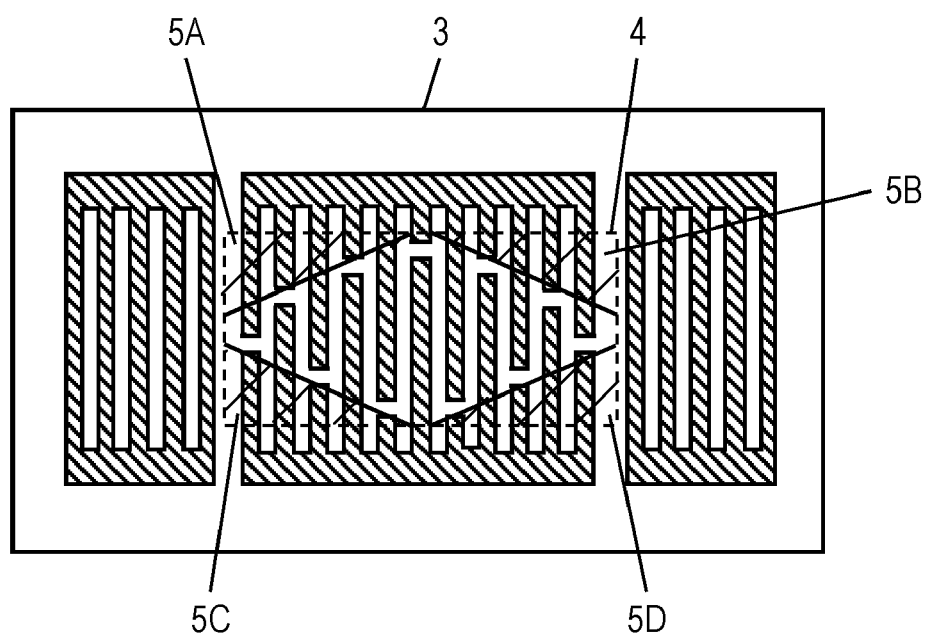
FIG. 29 is a top view of the conventional surface acoustic wave filter.
Figure 30:
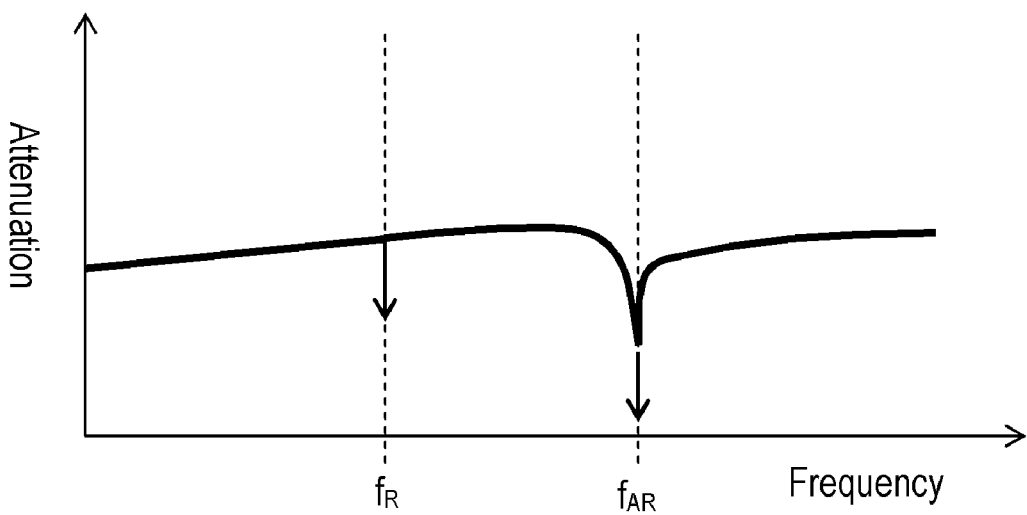
FIG. 30 shows transmission characteristics of a series resonator of the conventional surface acoustic wave filter.
Figure 31:
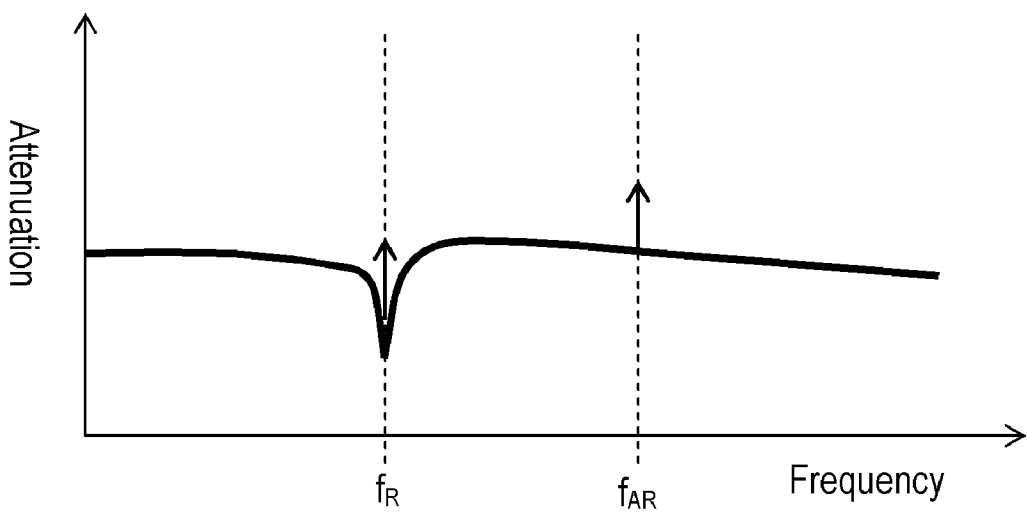
FIG. 31 shows transmission characteristics of a parallel resonator of the conventional surface acoustic wave filter.

Then, the characteristics depending on the pitch P1 of the comb electrodes 10A and 10B (12A and 12B) were evaluated. FIGS. 25A and 25B show transmission characteristics and an admittance of the resonator having the pitch P1 of 0.95 μm, respectively. FIGS. 26A and 26B show the transmission characteristics and the admittance of the resonator having the pitch P1 of 1.05 μm, respectively. The metallization ratio η is 0.50. The characteristics of the resonator having the pitch of 1.00 μm correspond to those shown in FIGS. 22A and 22B. In FIGS. 25A, 25B, 26A, and 26B, the spurious in a frequency region higher than the resonance frequency is caused in the transverse mode, and is suppressed by adjusting the apodized weighting factor. Spurious 901, 902, 2001, and 2002 increases as the pitch P1 increases. FIG. 27A shows the relationship between the pitch P1 and the transmission characteristics. FIG. 27B shows the relationship between the pitch P1 and the admittance. As shown in FIGS. 27A and 27B, the spurious increases as the pitch P1 increases. That is, the spurious increases as the resonance frequency of the resonator increases.

As described in above, three conditions of the surface acoustic wave resonator were confirmed regarding the spurious in the frequency region lower than the resonance frequency. The first condition is that the bias voltage applied to the piezoelectric substrate 9 for forming the dielectric layer 31 is increased to control the shape of the dielectric layer 31, accordingly suppressing the spurious, however, having characteristics particularly at the anti-resonance frequency of the surface acoustic wave resonator deteriorate. The second condition is that the increasing of the metallization ratio η of the comb electrodes 10A and 10B (12A and 12B) increases the Q factor at the anti-resonance frequency, however, increases the spurious. The third condition is that the decreasing of the pitch P1 of the comb electrodes 10A and 10B (12A and 12B), i.e., the increasing of the resonance frequency increases the spurious.

In the case that a ladder-type filter includes plural surface acoustic wave resonators, in general, the surface acoustic wave resonators provided at series arms have resonance frequencies different from those of the surface acoustic wave resonators provided at parallel arms. In order to provide a band-pass characteristic, the resonance frequencies of the surface acoustic wave resonators 7A to 7C are determined to be higher than the resonance frequencies of the surface acoustic wave resonators 8A and 8B. If the bias voltage applied to the piezoelectric substrate 9 is determined such that the spurious in the region lower than the resonance frequencies of the resonators 7A to 7B provided at the series arms, the bias voltage becomes excessively high for the resonators 8A and 8B provided at the parallel arm, and may have characteristics of the resonators 8A and 8B deteriorate. The deteriorating of the characteristics of the resonators 8A and 8B provided at the parallel arms can be suppressed based on the above three conditions of the spurious, thereby providing the surface acoustic wave filter 1001 with preferable characteristics. That is, the metallization ratio of the surface acoustic wave resonators 7A to 7C having high resonance frequencies are determined to be larger than the metallization ratio of the surface acoustic wave resonators 8A and 8B having low resonance frequencies, thereby suppressing the spurious in the Rayleigh mode.

Thus, the apodized weighting factor and the metallization ratio 1 of the surface acoustic wave resonator are determined appropriately to reduce the spurious in both the transverse mode and the Rayleigh mode, thus providing the filter 1001 with preferable characteristics. The apodized weighting factor and the metallization ratio η are also applicable to the boundary acoustic wave filter 1002 shown in FIG. 14, providing the same effects.

Terms, such as "upper surface" and "directly above", indicating directions do not indicate absolute directions, such as vertical directions, but indicate relative directions defined by the positions of components, such as piezoelectric substrate 9.

What is claimed is:

1. A surface acoustic wave filter comprising:
    a piezoelectric substrate made of lithium niobate;
    a series resonator including a first interdigital transducer electrode provided on the piezoelectric substrate;
    a parallel resonator including a second interdigital transducer electrode provided on the piezoelectric substrate, the parallel resonator being electrically connected to the series resonator; and
    a dielectric layer covering at least one of the first interdigital transducer electrode or the second interdigital transducer electrode, wherein
    the series resonator has a first excitation region which includes a first electrode facing region and a first non-electrode facing region;
    the parallel resonator has a second excitation region which includes a second electrode facing region and a second non-electrode facing region;
    a first apodized weighting factor which is a ratio of an area of the first non-electrode facing region to an area of the first excitation region is smaller than a second apodized weighting factor which is a ratio of an area of the second non-electrode facing region to an area of the second excitation region; and
    the piezoelectric substrate is made of −30° to +30° rotated Y-cut lithium niobate.

2. The surface acoustic wave filter of claim 1, wherein the dielectric layer is made of $SiO_2$ and has a thickness not less than 15% of a wavelength of an acoustic wave propagating through the piezoelectric substrate.

3. The surface acoustic wave filter of claim 1, wherein:
    the dielectric layer has a projection located on the at least one of the first interdigital transducer electrode or the second interdigital transducer electrode;
    the projection of the dielectric layer has an upper surface located above the at least one of the first interdigital transducer electrode or the second interdigital transducer electrode; and
    the upper surface of the projection has a width smaller than a width of the at least one of the first interdigital transducer electrode or the second interdigital transducer electrode.

4. The surface acoustic wave filter of claim 1, wherein the first apodized weighting factor is larger than zero.

5. The surface acoustic wave filter of claim 1, wherein the second apodized weighting factor is not less than 0.5.

6. The surface acoustic wave filter of claim 1, further comprising:
    an input terminal; and
    an output terminal, wherein:

the series resonator is connected in series between the input terminal and the output terminal; and the parallel resonator is connected in parallel to the input terminal and the output terminal.

7. An antenna duplexer comprising:

an antenna terminal arranged to be connected to an antenna;

a transmitting terminal arranged to be connected to a transmitting circuit;

a receiving terminal arranged to be connected to a receiving circuit;

a transmitting filter connected between the antenna terminal and the transmitting terminal; and a receiving filter connected between the antenna terminal and the receiving terminal, wherein:

at least one of the transmitting filter or the receiving filter comprises;

a piezoelectric substrate made of lithium niobate;

a series resonator including a first interdigital transducer electrode provided on the piezoelectric substrate;

a parallel resonator including a second interdigital transducer electrode provided on the piezoelectric substrate, the parallel resonator being electrically connected to the series resonator; and a dielectric layer covering at least one of the first interdigital transducer electrode or the second interdigital transducer electrode, wherein:

the series resonator has a first excitation region which includes a first electrode facing region and a first non-electrode facing region;

the parallel resonator has a second excitation region which includes a second electrode facing region and a second non-electrode facing region;

a first apodized weighting factor which is a ratio of an area of the first non-electrode facing region to an area of the first excitation region is smaller than a second apodized weighting factor which is a ratio of an area of the second non-electrode facing region to an area of the second excitation region; and the piezoelectric substrate is made of −30° to +30° rotated Y-cut lithium niobate.

8. The antenna duplexer of claim 7, wherein the dielectric layer is made of $SiO_2$ and has a thickness not less than 15% of a wavelength of an acoustic wave propagating through the piezoelectric substrate.

9. The antenna duplexer of claim 7, wherein:

the dielectric layer has a projection located on the at least one of the first interdigital transducer electrode or the second interdigital transducer electrode;

the projection of the dielectric layer has an upper surface located above the at least one of the first interdigital transducer electrode or the second interdigital transducer electrode; and the upper surface of the projection has a width smaller than a width of the at least one of the first interdigital transducer electrode or the second interdigital transducer electrode.

10. The antenna duplexer of claim 7, wherein the first apodized weighting factor is larger than zero.

11. The antenna duplexer of claim 7, wherein the second apodized weighting factor is not less than 0.5.

12. A surface acoustic wave filter comprising:

a piezoelectric substrate made of lithium niobate;

a series resonator including a first interdigital transducer electrode provided on the piezoelectric substrate;

a parallel resonator including a second interdigital transducer electrode provided on the piezoelectric substrate, the parallel resonator being electrically connected to the series resonator; and a dielectric layer covering at least one of the first interdigital transducer electrode or the second interdigital transducer electrode, wherein the piezoelectric substrate is made of −30° to +30° rotated Y-cut lithium niobate, wherein:

an apodized weighting factor of the first interdigital transducer electrode is smaller than an apodized weighting factor of the second interdigital transducer electrode.

13. The surface acoustic wave filter of claim 12, wherein the dielectric layer is made of $SiO_2$ and has a thickness not less than 15% of a wavelength of an acoustic wave propagating through the piezoelectric substrate.

14. The surface acoustic wave filter of claim 12, wherein:

the dielectric layer has a projection located on the at least one of the first interdigital transducer electrode or the second interdigital transducer electrode;

the projection of the dielectric layer has an upper surface located above the at least one of the first interdigital transducer electrode or the second interdigital transducer electrode; and the upper surface of the projection has a width smaller than a width of the at least one of the first interdigital transducer electrode or the second interdigital transducer electrode.

15. An antenna duplexer comprising:

an antenna terminal arranged to be connected to an antenna;

a transmitting terminal arranged to be connected to a transmitting circuit;

a receiving terminal arranged to be connected to a receiving circuit;

a transmitting filter connected between the antenna terminal and the transmitting terminal;

a receiving filter connected between the antenna terminal and the receiving terminal, wherein:

at least one of the transmitting filter or the receiving filter comprises;

a piezoelectric substrate made of lithium niobate;

a series resonator including a first interdigital transducer electrode provided on the piezoelectric substrate; and a parallel resonator including a second interdigital transducer electrode provided on the piezoelectric substrate, the parallel resonator being electrically connected to the series resonator; and a dielectric layer covering at least one of the first interdigital transducer electrode or the second interdigital transducer electrode, wherein the piezoelectric substrate is made of −30° to +30° rotated Y-cut lithium niobate, and wherein:

an apodized weighting factor of the first interdigital transducer electrode is smaller than an apodized weighting factor of the second interdigital transducer electrode.

16. The antenna duplexer of claim 15, wherein the dielectric layer is made of $SiO_2$ and has a thickness not less than 15% of a wavelength of an acoustic wave propagating through the piezoelectric substrate.

17. The antenna duplexer of claim 15, wherein:

the dielectric layer has a projection located on the at least one of the first interdigital transducer electrode or the second interdigital transducer electrode;

the projection of the dielectric layer has an upper surface located above the at least one of the first interdigital transducer electrode or the second interdigital transducer electrode; and the upper surface of the projection has a width smaller than a width of the at least one of the first interdigital transducer electrode or the second interdigital transducer electrode.

18. The surface acoustic wave filter of claim 12, wherein the apodized weighting factor of the first interdigital transducer electrode is larger than zero.

19. The surface acoustic wave filter of claim 12, wherein the apodized weighting factor of the second interdigital transducer electrode is not less than 0.5.

20. The antenna duplexer of claim 15, wherein the apodized weighting factor of the first interdigital transducer electrode is larger than zero.

21. The antenna duplexer of claim 15, wherein the apodized weighting factor of the second interdigital transducer electrode is not less than 0.5.

* * * * *